US012141688B2

(12) United States Patent
Pesic et al.

(10) Patent No.: US 12,141,688 B2
(45) Date of Patent: *Nov. 12, 2024

(54) CRESTED BARRIER DEVICE AND SYNAPTIC ELEMENT

(71) Applicant: Applied Materials, Inc., Santa Clara, CA (US)

(72) Inventors: Milan Pesic, Paoli, PA (US); Shruba Gangopadhyay, San Jose, CA (US); Muthukumar Kaliappan, Fremont, CA (US); Michael Haverty, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 546 days.

This patent is subject to a terminal disclaimer.

(21) Appl. No.: 17/380,318

(22) Filed: Jul. 20, 2021

(65) Prior Publication Data

US 2021/0350219 A1     Nov. 11, 2021

Related U.S. Application Data

(63) Continuation-in-part of application No. 16/857,589, filed on Apr. 24, 2020, now Pat. No. 11,404,636.

(51) Int. Cl.
*G06N 3/065* (2023.01)
*G11C 11/54* (2006.01)
(Continued)

(52) U.S. Cl.
CPC .............. *G06N 3/065* (2023.01); *G11C 11/54* (2013.01); *G11C 13/0011* (2013.01);
(Continued)

(58) Field of Classification Search
CPC .................................................. H01L 45/1233
See application file for complete search history.

(56) References Cited

U.S. PATENT DOCUMENTS

| 10,153,430 | B1 | 12/2018 | Kamalanathan et al. |
| 2012/0018695 | A1 | 1/2012 | Lee et al. |

(Continued)

FOREIGN PATENT DOCUMENTS

| JP | 2020-064897 A | 4/2020 |
| TW | 201814836 A | 4/2018 |

OTHER PUBLICATIONS

International Search Report and Written Opinion mailed Aug. 12, 2021 in International Patent Application No. PCT/US2021/028567, 7 pages.

(Continued)

*Primary Examiner* — Mounir S Amer
(74) *Attorney, Agent, or Firm* — Kilpatrick Townsend & Stockton LLP

(57) ABSTRACT

A crested barrier memory device may include a first electrode, a first self-rectifying layer, and a combined barrier and active layer. The first self-rectifying layer may be between the first electrode and the active layer. A conduction band offset between the first self-rectifying layer and the combined barrier and active layer may be greater than approximately 1.5 eV. A valence band offset between the first self-rectifying layer and the combined barrier and active layer may be less than approximately −0.5 eV. The device may also include a second electrode. The active layer may be between the first self-rectifying layer and the second electrode.

20 Claims, 19 Drawing Sheets

(51) Int. Cl.
*G11C 13/00* (2006.01)
*H10B 63/00* (2023.01)
*H10N 70/00* (2023.01)
*H10N 70/20* (2023.01)

(52) U.S. Cl.
CPC ........... *H10B 63/84* (2023.02); *H10N 70/023* (2023.02); *H10N 70/24* (2023.02); *H10N 70/8416* (2023.02); *H10N 70/8833* (2023.02)

(56) References Cited

U.S. PATENT DOCUMENTS

| | | |
|---|---|---|
| 2014/0042380 A1 | 2/2014 | Kim et al. |
| 2015/0039547 A1 | 2/2015 | Kang et al. |
| 2015/0097187 A1 | 4/2015 | Govoreanu et al. |
| 2016/0064453 A1 | 3/2016 | Hou et al. |
| 2016/0093802 A1 | 3/2016 | Hou et al. |
| 2019/0288202 A1 | 9/2019 | Yoo |
| 2020/0395410 A1 | 12/2020 | Grobis et al. |
| 2021/0336134 A1* | 10/2021 | Pešic ................. H10N 70/8833 |

OTHER PUBLICATIONS

Robertson, "High dielectric constant oxides," The European Physical Journal Applied Physics, vol. 28, No. 3, pp. 265-291, Dec. 2004.
Application No. PCT/US2021/028567, International Preliminary Report on Patentability, Mailed On Nov. 3, 2022, 6 pages.

* cited by examiner

| Material | Band Gap (eV) | k (ε-total) | K (ε-total) | Formation Energy (eV) | Ga₂O₃ (001/110) VBO (eV) | Ga₂O₃ (001/110) CBO (eV) | Co₃O₄ (110/001) VBO (eV) | Co₃O₄ (110/001) CBO (eV) | Material Phase |
|---|---|---|---|---|---|---|---|---|---|
| Co₃O₄ | 1.6 | 12 | | -1.4 | NA | NA | NA | NA | |
| TiO₂ | 3.2 | 63 | 6.8 | -3.5 | -0.4 to 0.5 for (001/110) | 0.1 to 1.0 for (110/001) | 1.2 to 2.5 for (110/001) | -0.9 to 0.4 for (001/110) | Anatase |
| TaO₃ | 3.3 | 38-65 for XTaO₃ | | -2.8 | -2.9 to -2.6 for (010) | 3.5 to 3.75 for (010) | -1.3 to -0.6 for (010) | 2.5 to 3.3 for (010) | -0.5 less stable than Ta₂O₅ |
| Ga₂O₃ | 2.7 | 12.5 | 5.1 | -2.3 | | | NA | NA | |
| BaHfO₃ | 3.9 | 40.70 | 4.7 | -3.8 | NA | NA | | | |
| SrHfO₃ | 5.2 | 36.9 | 4.3 | -3.8 | -0.9 to -0.6 for (001) | 3.3 to 3.5 for (001) | 0.7 to 1.4 for (001) | 2.2 to 2.9 for (001) | Monoclinic |
| SrHfO₃ | 5.2 | NA | 4.4 | -3.8 | -0.9 to -0.6 for (001) | 1.5 to 1.8 for (001) | 0.7 to 1.4 for (001) | 0.62 to 1.32 for (001) | Cubic |
| SrZrO₃ | 3.6 | 42.8 | 4.7 | -3.6 | -1.3 to -1.0 for (001) | 2.9 to 3.2 for (001) | 0.2 to 0.9 for (001) | 2.07 to 2.77 | Tetragonal |
| BaZrO₃ | 3.4 | 73.20 | 4.9 | -3.7 | -2.15 to -1.9 for (001) | -0.8 to -0.6 for (001) | -0.6 to 2.2 for (001) | 1.5 to 2.2 for (001) | Cubic |
| SrTiO₃ | 3.2 | 300 | | | -1.1 to -0.8 for (001) | 2.3 to 2.5 for (001) | 0.5 to 1.17 for (001) | 1.2 to 1.9 for (001) | |
| Sr₂Nb₂O₇ | 3.5 | 69 | 4.8 | -3.3 | -0.7 to -0.4 for (100) | 1.8 to 2.0 for (100) | 0.9 to 1.6 for (100) | 0.8 to 1.5 for (100) | |
| SrY₂O₄ | 4 | | | -3.7 | | | | | |

FIG. 17

CRESTED BARRIER DEVICE AND SYNAPTIC ELEMENT

CROSS-REFERENCE TO RELATED APPLICATIONS

This application is a continuation-in-part of U.S. patent application Ser. No. 16/857,589, filed Apr. 24, 2020, entitled "CRESTED BARRIER DEVICE AND SYNAPTIC ELEMENT," which is hereby incorporated herein by reference in its entirety.

TECHNICAL FIELD

This disclosure generally relates to memory and selector devices that can be used in neural network. More specifically, this disclosure describes a crested barrier memory and selector device using various materials.

BACKGROUND

A modern electronic neural network includes digital and/or analog circuitry that is inspired by, and seeks to approximate, the biological neural networks used by neurological systems found in nature. Like their natural counterparts, electronic neural networks attempt to learn and perform various tasks and recognize input stimuli without being pre-programmed using tasks-specific rules. This learning process may be accomplished using a collection of connected nodes representing artificial neurons which operationally approximate the behavior of neurons in a biological system. Connections between neurons may approximate the behavior of biological synapses to transmit signals between one or more artificial neurons. Multiple successive layers of neuron-and-synapse connections can be chained together to break complex tasks down into incremental stages. Therefore, an electronic neural network can be taught to perform new tasks in the same way that biological neural networks learn and grow over time.

SUMMARY

In some embodiments, a crested barrier memory device may include a first electrode, a first self-rectifying layer, and a combined barrier and active layer. The first self-rectifying layer may be between the first electrode and the active layer. A conduction band offset between the first self-rectifying layer and the combined barrier and active layer may be greater than approximately 1.5 eV. A valence band offset between the first self-rectifying layer and the combined barrier and active layer may be less than approximately −0.5 eV. The device may also include a second electrode. The active layer may be between the first self-rectifying layer and the second electrode.

In some embodiments, a method of fabricating a crested barrier memory device may include depositing a first electrode, depositing a first self-rectifying layer above the first electrode, and depositing a combined barrier and active layer over the first self-rectifying layer. A conduction band offset between the first self-rectifying layer and the combined barrier and active layer may be greater than approximately 1.5 eV. A valence band offset between the first self-rectifying layer and the combined barrier and active layer may be less than approximately −0.5 eV. The method may also include depositing a second electrode above the combined barrier and active layer.

In any embodiments, any and/or all of the following features may be included in any combination and without limitation. The device may also include a second self-rectifying layer between the combined barrier and active layer and the second electrode. The conduction band offset may be less than approximately 3.5 eV. The valence band offset may be greater than approximately −1.5 eV. There need not be any barrier layer between the first self-rectifying layer and the combined barrier and active layer such that these two layers are directly adjacent. The device may also include one or more connections to a plurality of other crested barrier memory and selector devices in a neural network. The device may model the behavior of a synapse. A dielectric constant of the first self-rectifying layer may be at least 1.5 times larger than a dielectric constant of the combined barrier and active layer. The combined barrier and active layer may have a higher diffusion constant than titanium oxide. The combined barrier and active layer may include $V_2O_5$, $Ta_2O_5$, $CuO$, $Fe_2O_3$, $ZnO$, or $Ga_2O_3$. The first self-rectifying layer may include cobalt oxide. The first self-rectifying layer may include $Ga_2O_3$, IGZO, or $Cr_2O_3$. The combined barrier and active layer may include titanium oxide. The titanium oxide may be doped with Cr, Mo, V, Nb, Ta, Zr, or Hf. The combined barrier and active layer may include $SrHfO_3$, $BaZrO_3$, $SrZrO_3$, $Sr_2Nb_2O_7$, or $SrY_2O_4$. The first electrode may include a first material and the second electrode may include a second material that is different from the first material, and a work function associated with first electrode may be less than a work function associated with the second electrode. The first electrode may include titanium nitride and the second electrode comprises platinum. A tunneling distance may represent a length of the crested barrier memory device when 0 V is applied.

In some embodiments, a crested barrier memory and selector device may include a first electrode, a first tunneling layer having a first dielectric constant, and an active layer having a second dielectric constant. The first tunneling layer may be between the first electrode and the active layer, and the second dielectric constant may be at least 1.5 times larger than the first dielectric constant. The device may also include a second tunneling layer having a third dielectric constant. The second tunneling layer may be between the active layer and the second electrode, and the second dielectric constant may be at least 1.5 times larger than the third dielectric constant. The device may further include a second electrode, where the active layer may be between the first tunneling layer and the second electrode.

In some embodiments, a method of fabricating a crested barrier memory and selector device may include depositing a first electrode, depositing a first tunneling layer on top of the first electrode, where the first tunneling layer has a first dielectric constant, and depositing an active layer comprising on top of the first tunneling layer. The active layer may include a second dielectric constant, the first tunneling layer may be between the first electrode and the active layer, and the second dielectric constant may be at least 1.5 times larger than the first dielectric constant. The method may also include depositing a second electrode, where the active layer is between the first tunneling layer and the second electrode.

In any embodiments, any and/or all of the following features may be included in any combination and without limitation. The device may further include a third tunneling layer between the first tunneling layer and the active layer. The second dielectric constant may be between approximately 30 and approximately 60. The second dielectric constant may be approximately 40. The first dielectric constant may be between approximately 8 and approximately 17. the first dielectric constant may be approximately 4. The device may additionally include one or more connections to a plurality of other crested barrier memory and selector devices in a neural network. The device may model the behavior of a synapse. The device wherein there is no barrier layer between the first tunneling layer and the active layer. The second dielectric constant may be at least 2.5 times larger than the first dielectric constant. Fabricating the device may also include depositing a second tunneling layer on top of the active layer, where the second tunneling layer has a third dielectric constant, the second electrode may be deposited on top of the second tunneling layer, and the second dielectric constant may be at least 1.5 times larger than the third dielectric constant. The first tunneling layer may include cobalt oxide. The active layer may include titanium oxide. The active layer may include hafnium oxide. The first tunneling layer may include titanium oxide having a phase and crystal lattice structure such that the second dielectric constant is less than 10. The first electrode may include a first material and the second electrode may include a second material that is different from the first material. A work function associated with first electrode may be less than a work function associated with the second electrode. The first electrode may include titanium nitride and the second electrode may include platinum. A tunneling distance of the device may be a length of the crested barrier memory and selector device when 0 V is applied.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an FIG. 1 illustrates a diagram of a portion of a neural network, according to some embodiments.

FIG. 17 illustrates a table of material properties for the potential replacement materials that may be used in the crested barrier device, according to some embodiments.

DETAILED DESCRIPTION

Figure 1:
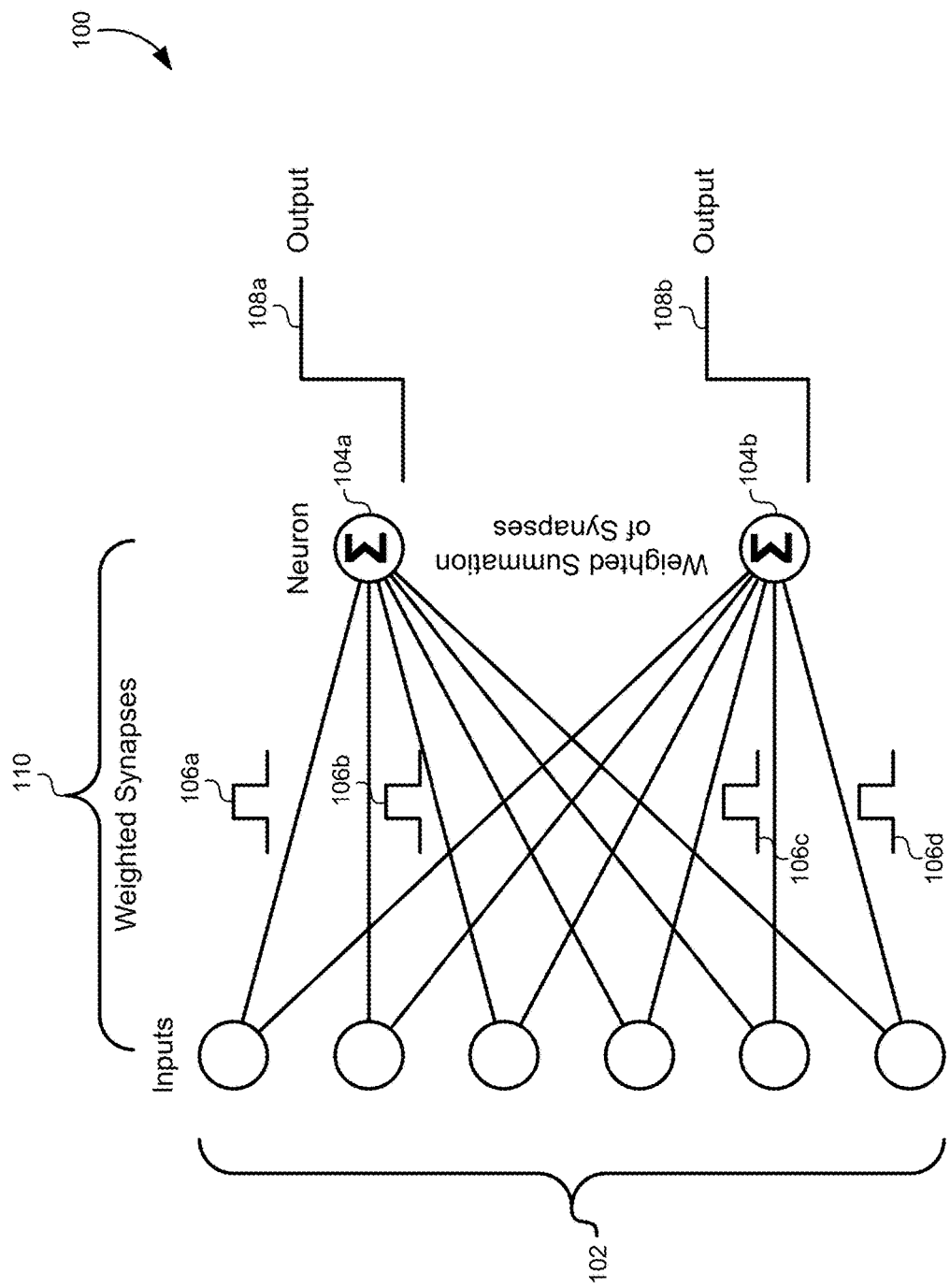

FIG. 1 illustrates a diagram of a portion of a neural network 100, according to some embodiments. The neural network 100 includes a plurality of inputs 102. The inputs may correspond to an input in a biological system, such as an axon representing a nerve fiber or a long slender projection of a neuron that conducts electrical impulses and acts as a transmission line in the nervous system. For example, the plurality of inputs 102 may represent axons tied to respective photoreceptors used to encode received light in the surrounding environment and transmit an electrical signal representing the received light. The electrical signal may be scaled to represent a magnitude or intensity of a received signal. For example, the plurality of inputs 102 may generate electrical signals that are proportional to an intensity of a received light signal. It should be noted that the use of photoreceptors and image recognition is provided merely by way of example and is not meant to be limiting. Other types of biological and electrical neural networks may be used to receive and process any type of input.

After receiving an input signal at the plurality of inputs 102, each of the plurality of inputs 102 may transmit pulses 106 to one or more neurons 104. The neural network 100 illustrates these pathways between the inputs 102 and the neurons 104 as a plurality of synapses 110. In a biological nervous system, a synapse is a structure that permits a neuron or nerve cell to pass an electrical or chemical signal to another neuron. In the neural network 100, biological synapses may be modeled using synapses 110 that pass a signal that is amplified/attenuated by synapse weights between the inputs 102 and the neurons 104 that represents the magnitude of the signal received by the inputs 102. The synapses 110 may also be weighted. For example, a single one of the plurality of inputs 102 may receive an input signal that is weighted differently by the synapses as it is sent to different neurons 104. The weighting of synapses 110 is what allows a neural network to "learn" to recognize specific input patterns and perform specific output tasks. When modeling the synapses 110 in a neural network, they may be represented by a semiconductor device that can receive a plurality of sequential input pulses and generate a corresponding output. For example, each input pulse may cause the synapse output to gradually increase between a logic 0 and a logic 1 level.

The synapses 110 may connect the inputs 102 to one or more neurons 104. These connections may be made in a one-to-many topology between the inputs 102 and the neurons 104. The neurons 104 in the neural network may be modeled after biological neurons, which are electrically excitable cells that communicate with other cells between connecting synapses. After receiving a sufficient number of input impulses, a neuron 104 may "fire" or transition into an excited state. The state may be associated with a sensory response (e.g., touch, sound, light, etc.) and/or motor controls from the brain. To approximate the behavior of a biological neuron, the neurons 102 in the neural network 100 may be implemented using any device that can receive a plurality of input pulses from one or more synapses 110, and after receiving a threshold number of input pulses, cause the outputs 108 of the neurons 104 to toggle between logic 0 and logic 1 states.

FIG. 1 illustrates a greatly simplified view of the neural network 100 in order to describe the various network components clearly. In practice, the neural network 100 may also include one or more hidden layer neurons and synapses between the inputs 102 and the outputs 108. These hidden or intermediate layers allow the task of generating the final outputs 108 to be broken down into sub-steps, each of which may be represented by a corresponding hidden layer of synapses and neurons. For example, the neural network 100 may be configured to distinguish between two different types of images, causing output 108a to fire when recognizing a first type of image, and causing output 108b to fire when recognizing a second type of image. A first hidden layer of neurons and synapses may recognize edges within the images. A second hidden layer of neurons and synapses may recognize shapes forwarded by the edges within the images. Finally, the neurons 104 in the output stage may combine the recognized shapes to distinguish between the first and second image types. Therefore, the neural network 100 may be far more complex in terms of electrical components and connections than may be readily apparent in FIG. 1. Because of the size, complexity, speed requirements, and/or routing difficulties that may accompany complex modern neural networks, there is a great need for circuit elements that can represent biological neurons and synapses in a way that can still allow for efficient layout and fabrication of many devices on a single technology node.

A neural network represents only one of many applications that may utilize the devices described in detail below. It should be understood that the example of a neural network is not meant to be limiting, but provides just one example of an operating environment that may benefit from the low-power characteristics of these devices.

Figure 2:
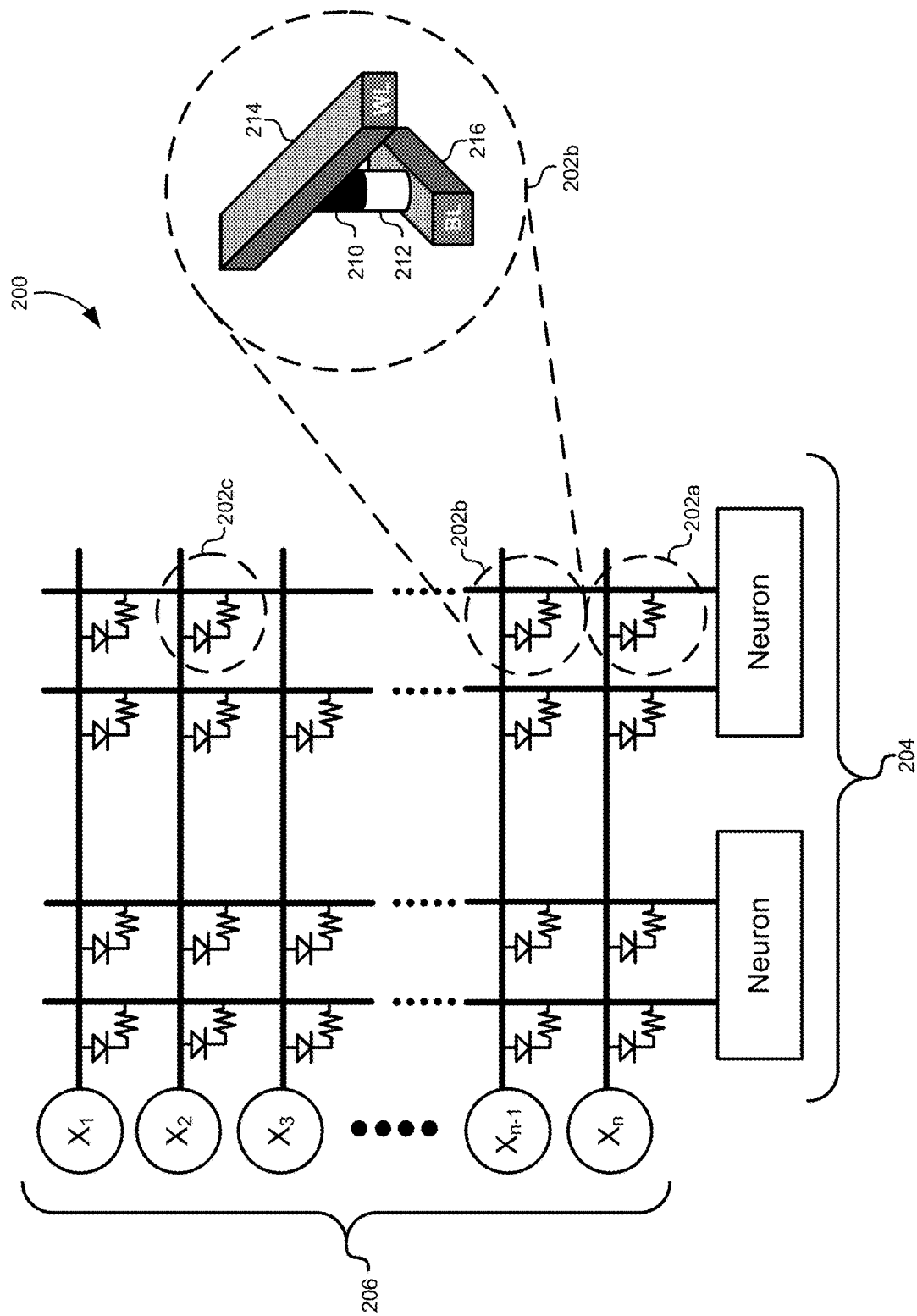
FIG. 2 illustrates a circuit network that implements a neural network, according to some embodiments.

FIG. 2 illustrates a circuit network 200 that implements a neural network, according to some embodiments. The neural network represented by the circuit network 200 may be similar to the neural network 100 in FIG. 1. As was the case for FIG. 1, FIG. 2 is a simplified view of a simple neural network where many connections and/or hidden layers may have been omitted for the sake of clearly describing the various circuit components that can be used to represent neurons and synapses. The circuit network 200 includes a plurality of inputs 206 that may correspond to the inputs 102 of FIG. 1. The inputs may be connected to a plurality of devices representing neurons 204 through devices representing synapses 202.

Many different devices may be used to represent synapses in the circuit network 200. In some embodiments, the synapses 202 may be implemented using semiconductor devices that can receive a plurality of input pulses and provide a proportional output to the neurons 204. Additionally, the neurons 204 may also be represented by discrete circuit devices. However, in contrast to the synapses 202 that gradually change their conductance with arriving excitation pulses, the neurons 204 may be configured to receive a plurality of pulses from the synapses 202 and fire after threshold number of pulses have been received. This basic network of circuit connections between the inputs 206 and the output neurons 204 may be augmented using hidden layers of transistors and/or other two-terminal resistive devices representing hidden layers of neurons and synapses as described above. When implementing the circuit network 200, it therefore may be beneficial to use semiconductor devices that can implement both the analog behavior of the synapses and the digital behavior of the neurons.

In some embodiments, many different types of devices may be used to implement the basic components of a neural network. For example, some embodiments may use a specific type of transistor known as a ferroelectric field-effect transistor (FeFET). A FeFET is a logic transistor that can maintain its logical state even when power is removed. FeFETs are similar to traditional metal oxide silicate (MOS) transistors, except that the logic gate dielectric is replaced with a ferroelectric material, which is a dielectric that "remembers," or stores electric fields to which it has been exposed. In a FeFET, a persistent dipole may be formed within the gate dielectric itself, thereby splitting the threshold voltage of the FeFET into two stable states that can represent binary logic states. Other embodiments may use ferroelectric FinFET devices.

In the embodiments described herein, the synapses may be represented by individual two-terminal memory elements. When using memory devices to model synapses, the circuit network 200 may be viewed as a form of non-volatile memory array. Each of the memory elements representing synapses 202 may be arranged in a rectangular grid pattern. In some embodiments, the grid pattern may be three-dimensional such that multiple grids lie above and below each other, as in a crosspoint memory array. Each of the memory elements may be configured to receive an applied voltage, and based on the polarity of the applied voltage, the memory elements representing the synapses 202 may change a physical state of a material in the memory element to represent a saved logic state, such as a logic 1 and a logic 0. When the voltage is no longer applied, the memory elements 202 may save the logic state induced by the applied voltage, and thus may operate as non-volatile memory elements.

In order to apply the voltage needed to read/write to the memory elements, signals may be received from the horizontal lines from the plurality of inputs 206. These horizontal lines may act as a word line in a traditional memory array. The bit lines may run in a perpendicular direction and connect to the output neurons 204. Therefore, applying a voltage between a single one input of the word lines and a single input of the bit lines may cause voltage to be applied across a single one of the memory elements representing synapses 202. This process can be used to select a single synapse 202 for a read and/or write operation.

FIG. 2 illustrates a detailed view of a single synapse 202b. This synapse 202b shows a word lines 214 and a bit lines 216 coupled to a selector device 210 and a memory device 212. To minimize the leakage current through the circuit network 200, and to isolate memory elements connected on the same word/bit lines, the synapse 202c may each include the selector device 210. The selector device 210 may be implemented between the memory device 212 and the word line 216. The selector device 210 may be used to reduce current from leaking through an individual memory element (i.e. synapse 202b) and the leakage and power dissipation of the whole array, as well as to prevent disturbances while a synapse is passively addressed to access a cell/synapse on the same bitline/wordline (unless a desired memory element/synapse is selected and sufficient voltage above the selector threshold is received by the synapse 202b). Therefore, when the voltage is applied to the word line 214 and the bit line 216, the synapse 202b is accessed while the selector devices in synapse 202a and synapse 202c may prevent their associated memory devices from being affected by the voltage on the shared bit line 216. Although not shown explicitly in FIG. 2, three-terminal selecting devices may also be used, such as transistors, to form a 1T-1C cell.

Many different technologies may be used to implement the memory device 212, such as phase-change memories (PCMs), oxide-resistive random-access memory (oxR-RAMs) or conductive-bridging memories (CBRAM) to name a few. The embodiments described herein may use a specific type of memory device known as a resistive random-access memory (ReRAM). A ReRAM is a type of non-volatile, random-access computer memory that operates by changing a resistance across a dielectric solid-state material. Generally, filamentary ReRAM devices generate oxygen ion/vacancy pairs in an oxide layer. These oxide ions/vacancies can subsequently conduct electrical current while oxygen ions can drift under an electric field. The motion of oxygen atoms through these vacancies in the oxide is similar to the motion of electrons and holes in a traditional semiconductor device. Applying a voltage to the ReRAM device generates these oxide vacancies to decrease the resistance of the device. When the voltage is removed, the oxide vacancies may remain in place and thereby store a nonvolatile state of the conductance level of the ReRAM device.

Some specific ReRAM devices may be referred to as bulk ReRAM devices. Bulk ReRAM devices may change a conductance state by moving species (vacancies, ions, etc.) from one side to other side of the device. Bulk ReRAM devices may be used to mimic the specific type of synaptic behavior in a neural network as described above. Specifically, bulk-switching ReRAM devices may exhibit an analog response to received input pulses. As more input pulses are received by the device, the mobile species may gradually start to move from one part of the device to other part of the ReRAM device, and consequently the resistance of the device will gradually decrease. By gradually applying voltage pulses to the ReRAM device, the conductivity of the ReRAM device may be modulated in an analog fashion depending on the polarity, frequency, and duration of the applied voltage pulses. When used in this fashion, ReRAM devices may provide a very compact circuit footprint for mimicking synaptic behavior in the circuit network 200.

Figure 3A:
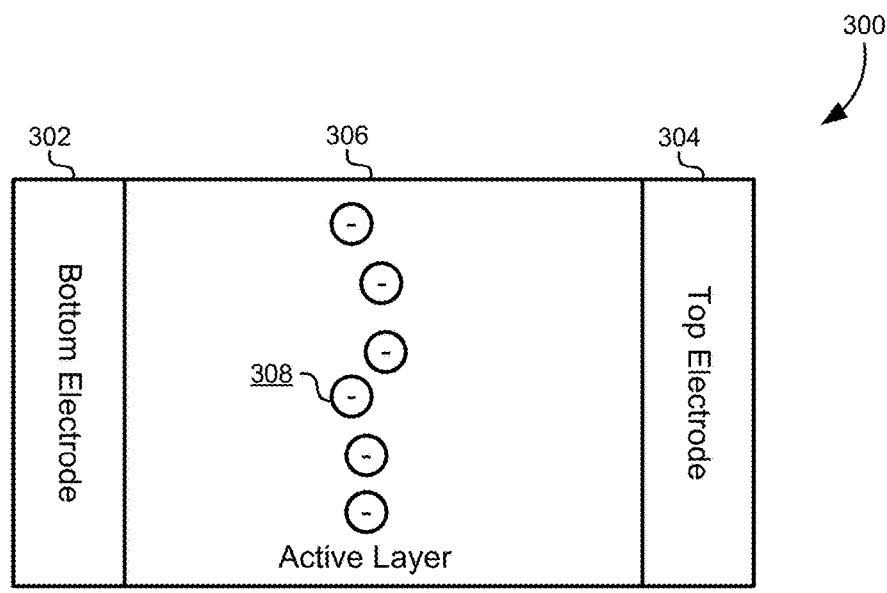
FIG. 3A illustrates an active region of a memory device that may be used in a neural network or other resistive memory circuit, according to some embodiments.

FIG. 3A illustrates an active layer of the memory device 300 between two electrodes that may be used in a neural network or other resistive memory circuit, according to some embodiments. The active layer of the memory device 300 may represent a bulk switching memory device that operates by applying a voltage between a pair of electrodes to move a mobile species in an active layer that is deposited between the two electrodes. A top electrode 304 and a bottom electrode may be formed using any type of metal or other conductor. The terms "top" and "bottom" may be interchangeable between the two electrodes, and these terms are merely used to distinguish between the two electrodes and not necessarily to imply order or location. When a voltage is applied across the bottom electrode 302 and the top electrode 304, defects, ions and other mobile species may move in an active layer 306 to modulate the energy barrier as seen by the electrons and holes between the bottom electrode 302 and the top electrode 304. The barrier may be transparent and allow current to flow through the active layer of the memory 300. For example, when the active layer of the memory device 300 is in the energetic state depicted with FIG. 3B with the mobile/charged species in the middle, the barrier seen by electrons and holes may be relatively high. Consequently, the barrier transparency and tunneling current may be relatively low and have a high resistance value. This may represent a logical 0. When the active layer of the memory 300 includes ions (or any other mobile species) that have drifted to one of the electrode interfaces, the barrier is shifted as shown in FIG. 4B, and a high barrier transparency and high tunneling current result to provide a low resistance value. This may represent a logical 1.

Figure 3B:
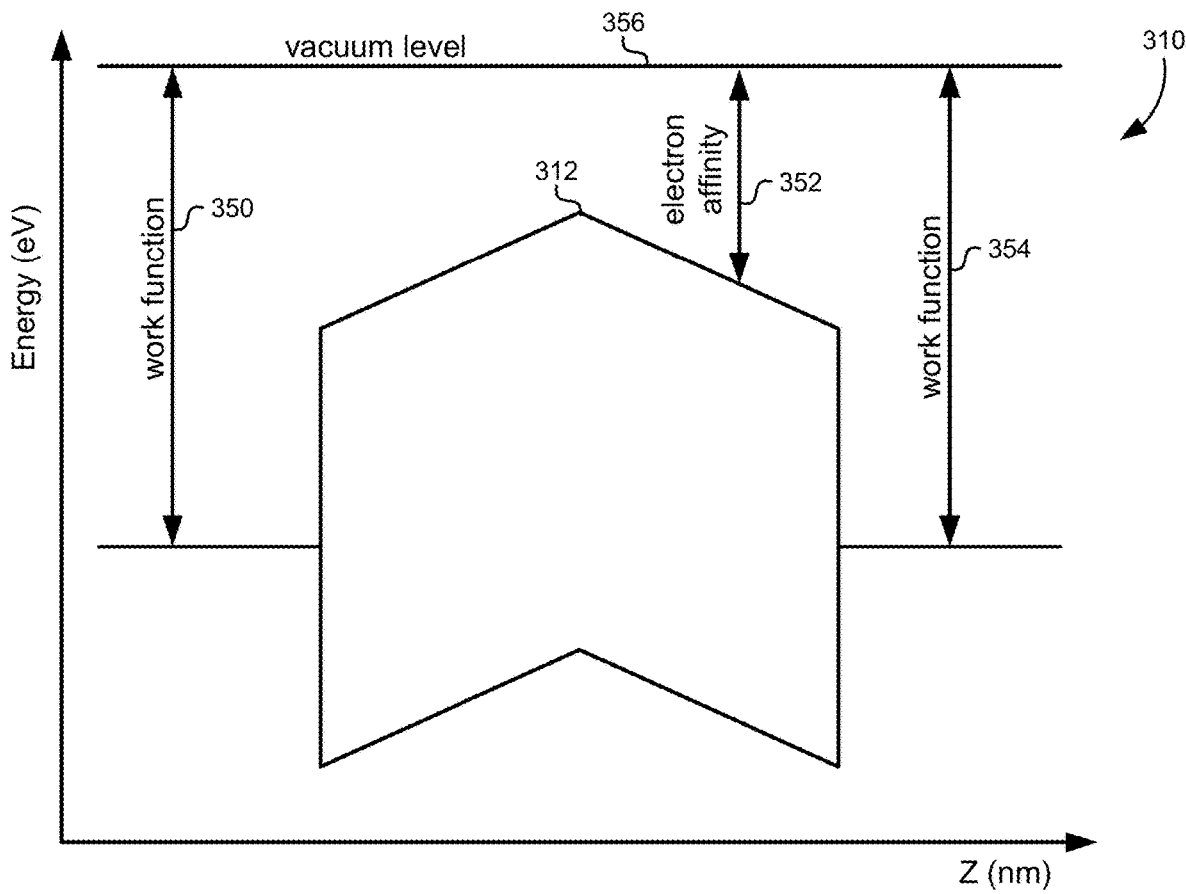
FIG. 3B illustrates a band diagram illustrating the energy levels required throughout the distance of the memory device, according to some embodiments.

FIG. 3B illustrates a band diagram 310 illustrating the energy levels required throughout the distance of the active layer of the memory 300, according to some embodiments. The band diagram 310 is drawn to scale relative to the active layer of the memory device 300 in FIG. 3A. For example, a peak 312 in the center of the band diagram 310 may correspond to the center of the active layer 306 of the memory device 300. Similarly, the non-electrode portion of the band diagram 310 begin/end such that the non-zero portion of the band diagram 310 lies between the bottom electrode 312 and the top electrode 304.

The active layer of the memory 300 may include a plurality of ions (or any other charged, mobile species, such as oxygen vacancies) 308 in the active layer 306. The active layer 306 may be formed using any transitional metal oxide (TMO) with high ionic mobility—or any TMO doped with other material incorporated in host lattice—having a relatively high dielectric constant and a relatively high defect and ionic mobility. For example, some embodiments may use titanium oxide and doped titanium oxide as an active layer 306. The ions 308 may include negative oxygen ions or positively charged oxygen vacancies that reside between the crystal lattice of the titanium oxide in the active layer 306. Without a voltage being applied across the bottom electrode 302 on the top electrode 304, the ions or any other mobile species 308 may reside near the center or at any other position of the active layer 306. The location of the mobile species 308 is illustrated by the peak 312 of the band diagram 310 that increases as the ions 308 are approached, then decreases as the band diagram 310 moves from the bottom electrode 302 to the top electrode 304. In some embodiments, the position of the mobile species 308 may be associated with a logical 0 for the memory active layer 300.

The energy levels of the various regions of the band diagram 310 may be characterized according to a vacuum level 356. Each of the electrodes 302, 304 may be characterized by a work function 350, 354 defining the energy to be transferred to the electron to ionize the electron to the vacuum level. The work function difference between the electrodes 302, 304 and the vacuum level 356 may represent a work function differential between the two electrodes. Similarly, the energy level of the active layer 306 may be characterized by an electron affinity 352 defining the energy difference between the conduction band of the active layer 306 and the vacuum level 356.

Figure 4A:
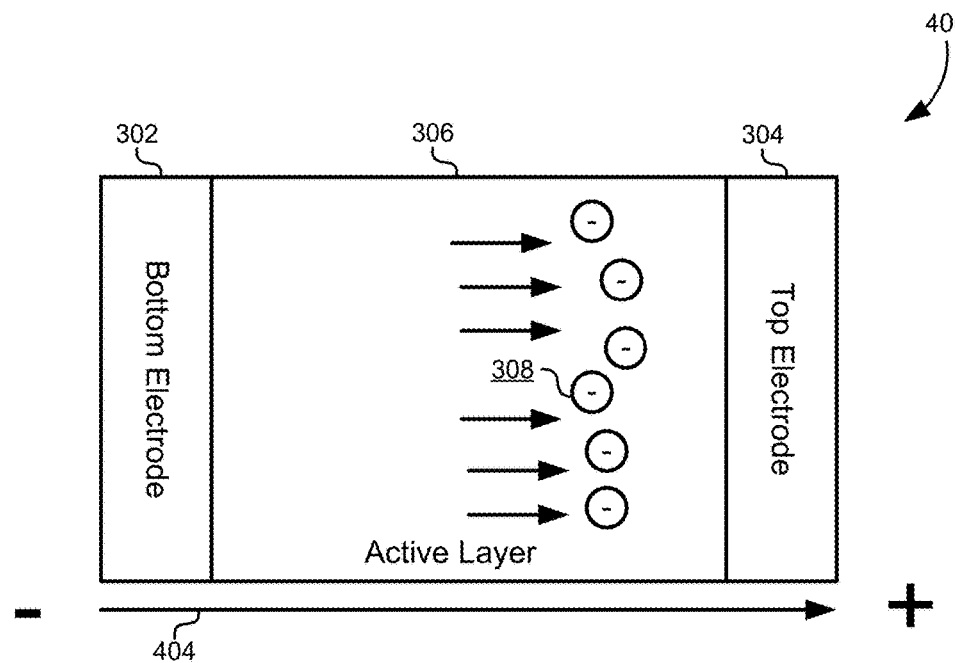
FIG. 4A illustrates a memory device with an applied voltage, according to some embodiments.
Figure 4B:
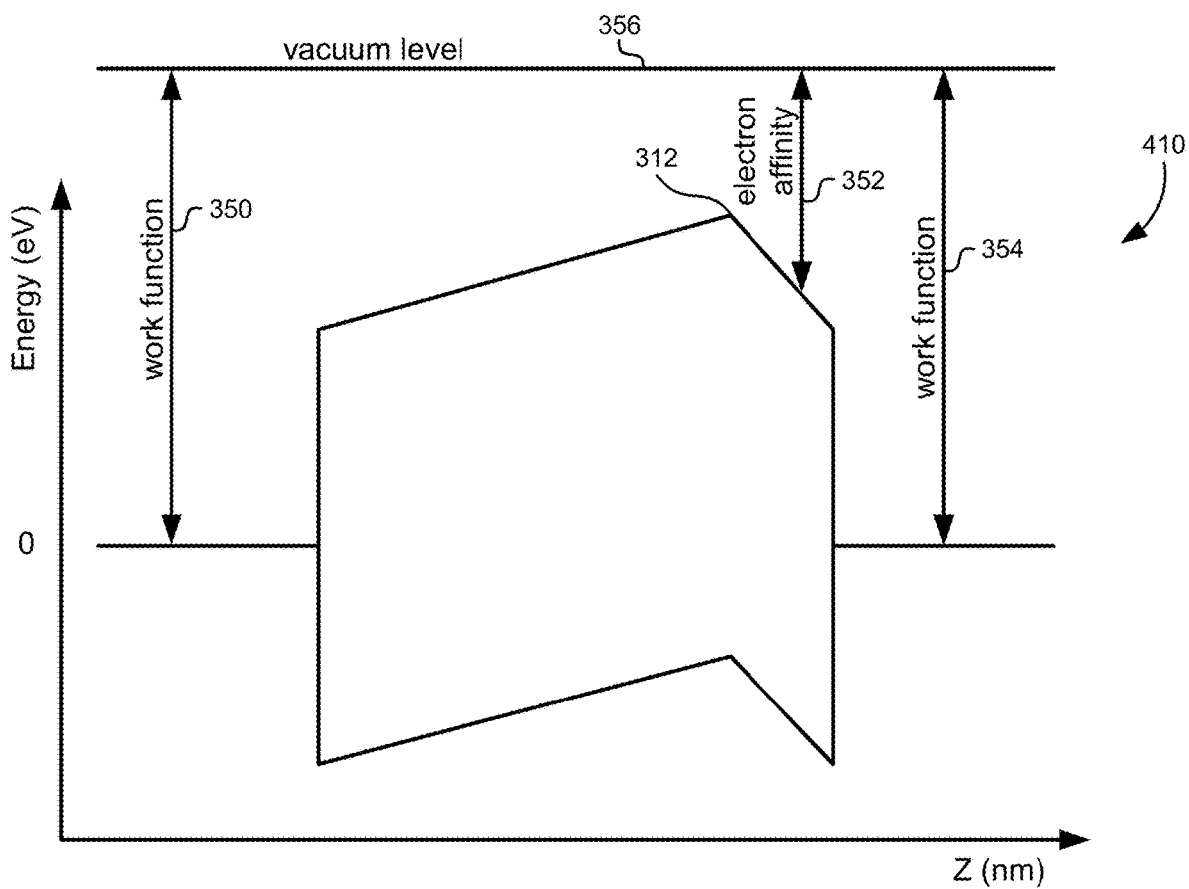
FIG. 4B illustrates a band diagram of the memory cell generated in response to the applied voltage, according to some embodiments.

FIG. 4A illustrates an active layer of the memory device 400 between two electrodes with an applied voltage 404, according to some embodiments. The voltage 404 may be applied across the bottom electrode 302 and the top electrode 304. Under the influence of the voltage 404, the ions (or any other charged mobile species) 308 in the active layer 306 may move towards the top electrode 304. As the ions 308 move towards the top electrode 304, the tunneling barrier may change its transparency (i.e., increase the tunneling probability) in the active layer 306, and the state of the active layer of the memory 400 may be associated with a logical 1.

FIG. 4B illustrates a band diagram 410 generated in response to the applied voltage 404, according to some embodiments. The shift of the position of the ions (or any other charged mobile species) 308 in the active layer 306 of the active layer of the memory 400 may be reflected in a shift in the peak 312 of the band diagram 410 to the right. Again, this shift may be caused by the application of the voltage 404 across the active layer of the memory 400. However, while the mobility of the ions 308 is relatively high during the application of the voltage 404, the mobility of the ions 308 decreases significantly when the voltage is removed. This causes the position of the ions 308 to remain near the top electrode 304 rather than immediately drifting back to the center of the active layer 306. This causes a shift in the band diagram of tunneling barrier 410 that persists even after the voltage 404 has been removed.

Figure 5A:
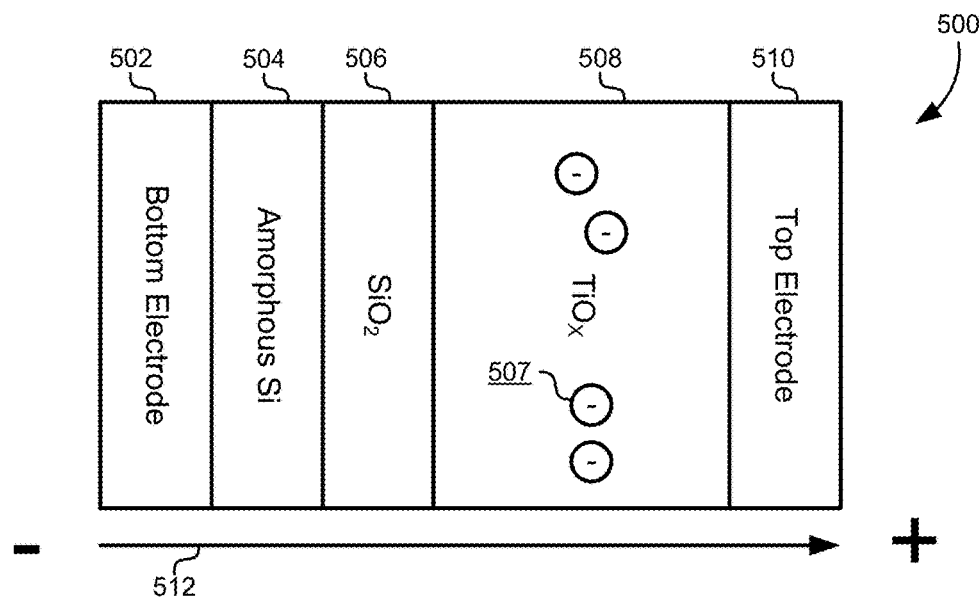
FIG. 5A illustrates a combination memory and selector device, according to some embodiments.

FIG. 5A illustrates a combination memory and selector device 500 with a current-voltage graph is discussed in FIG. 5, according to some embodiments. This device 500 includes a bottom electrode 502 and a top electrode 510. Instead of simply including a single active region as described above, this device 500 includes an amorphous silicon layer 504 next to the bottom electrode 502. Amorphous silicon may describe the non-crystalline form of silicon. Instead of forming a uniform monocrystalline or polycrystalline structure, amorphous silicon may form a continuous random network of molecules. Next to the amorphous silicon layer 504, a barrier layer of silicon dioxide ($SiO_2$) 506 may be deposited. Between the layer of silicon dioxide 506 and the top electrode 510, an active layer of titanium oxide ($TiO_x$) 508 may be deposited. The active layer 508 may include ions 507 as described in the devices above.

The active layer 508 may be between approximately 6 nm and approximately 13 nm thick. For example, the active layer 508 may be 6 nm, 8 nm, 9 nm, 10 nm, 11 nm, 12 nm, 13 nm, and/or the like in width. The combined width of the amorphous silicon layer 504 and the silicon dioxide layer 506 may be between approximately 1 nm and approximately 5 nm. For example, the combined width may be between approximately 1 nm-2 nm, 2 nm-3 nm, 3 nm-4 nm, 4 nm-5 nm, and/or the like. The amorphous silicon layer 504 may act as a selector device, the silicon dioxide layer 506 may act as a barrier layer, and the titanium oxide layer 508 may act as an active layer. This creates a combined selector and memory device (i.e., a self-rectifying memory device) with a barrier.

Figure 5B:
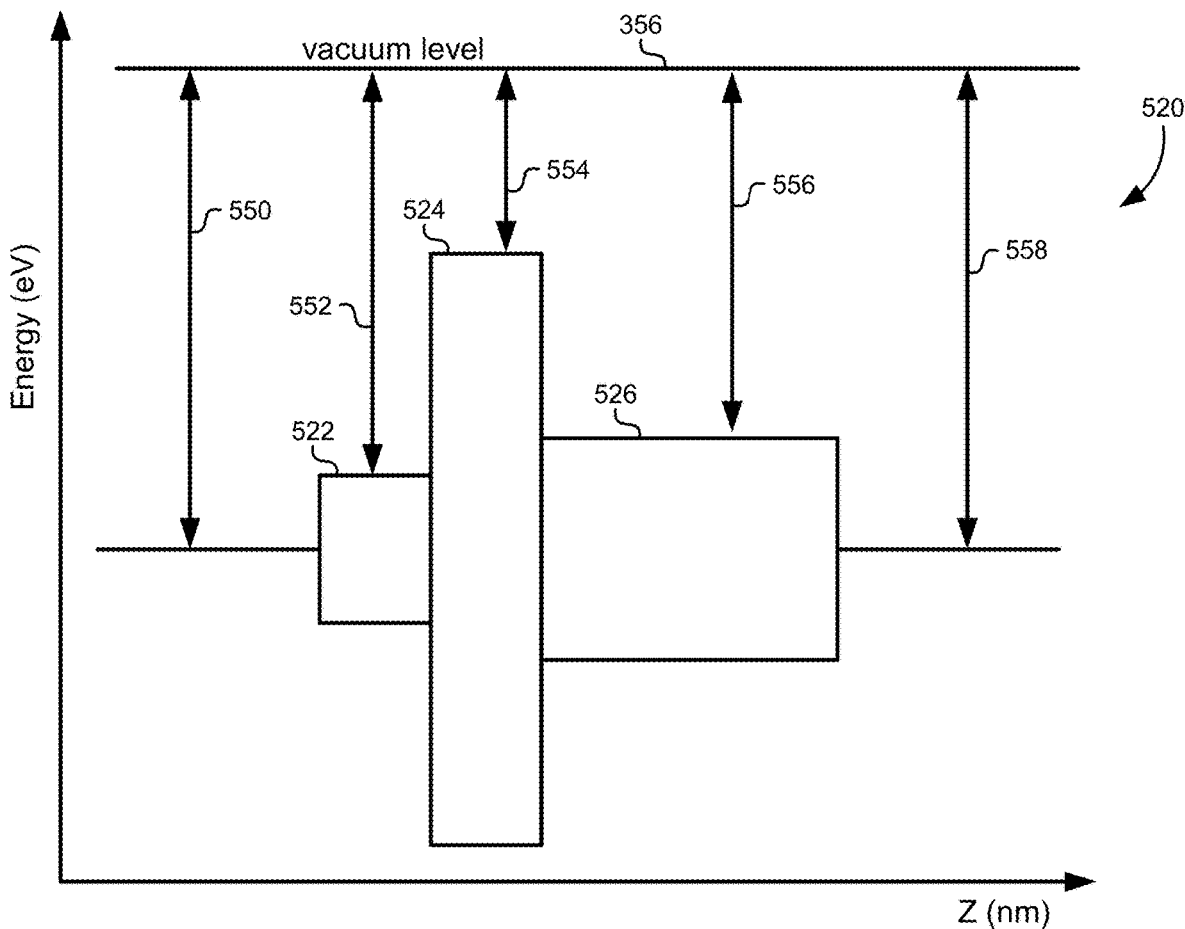
FIG. 5B illustrates a band diagram for the combination memory and selector device 600, according to some embodiments.

FIG. 5B illustrates a band diagram 520 for the combination memory and selector device 500, according to some embodiments. The energy barrier 522 attributable to the amorphous silicon layer 504 is relatively small in comparison to the much larger energy barrier 524 formed by the silicon dioxide layer 506. This barrier 524 allows the device to act as a selector, while the ions and filament formed in the active layer 508 allowed the device to act as a memory. The band diagram 520 illustrates the work functions 550, 558 for the electrodes 502, 510. The band diagram 520 also illustrates the electron affinity 552 for the amorphous silicon layer 504, the electron affinity 554 for the silicon dioxide layer 506, and the electron affinity 556 for the active layer 508.

Figure 6:
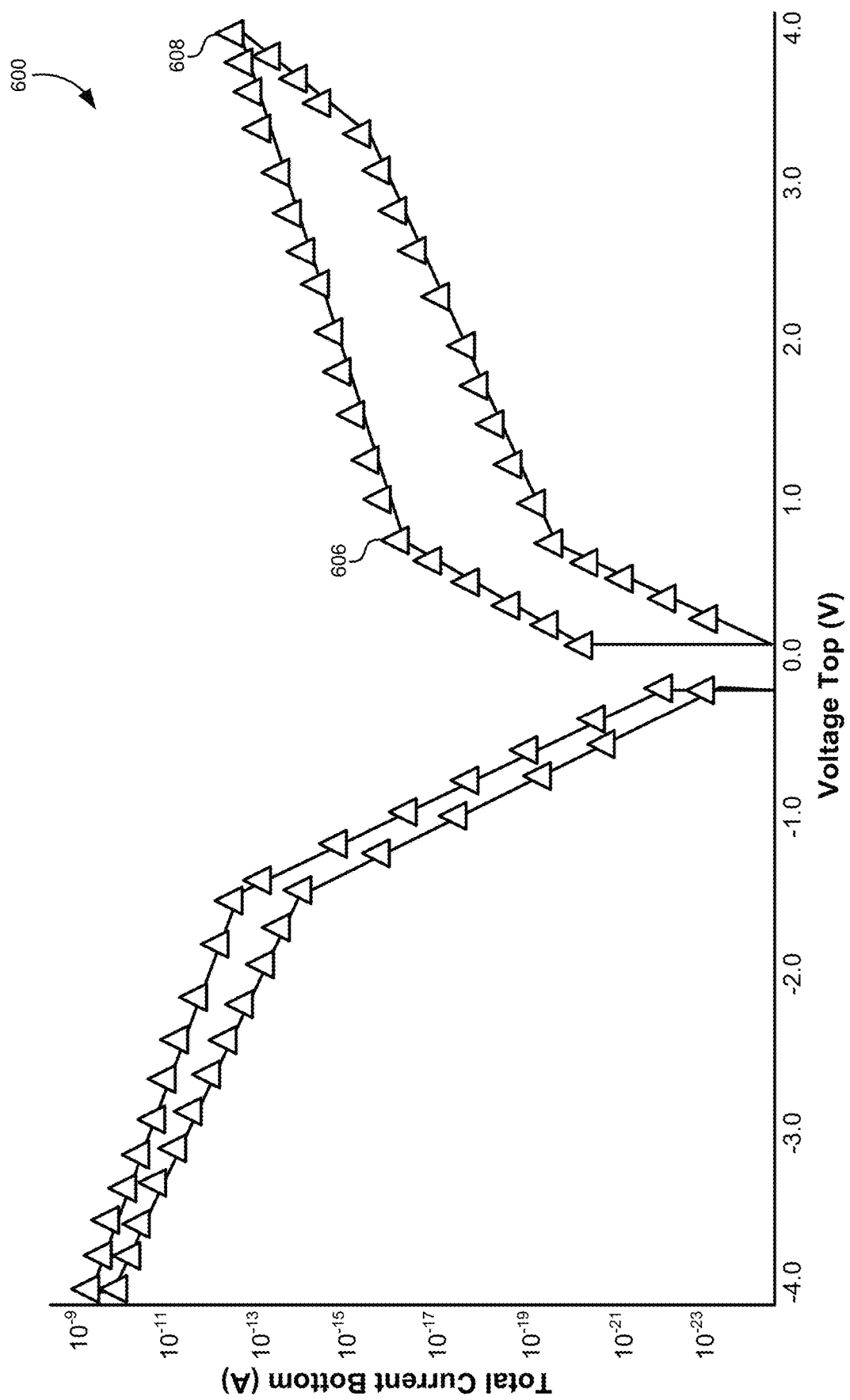
FIG. 6 illustrates a voltage/current graph for a memory cell with a discrete barrier layer and a separate active layer and selector, according to some embodiments.

FIG. 6 illustrates a voltage/current graph 600 for a memory cell with a discrete barrier layer and a separate active layer and selector, according to some embodiments. The graph 600 illustrates how the leakage current through the prior-art memory device increases rapidly with small increases in voltage. Recall from above that small voltages may be applied across the selector/memory element combination in a neural network. As illustrated in FIG. 6, a small increase of less than one volt may cause an increase in current 606 of a magnitude of more than $10^5$ A. Turning back to FIG. 4B, this leakage current may be caused in part by at least two factors. First, the barrier between the top electrode 304 and the active layer 306 is simply too small. The energy difference is small enough that electrons can too easily cross the barrier and conduct through the active layer 306. Additionally, the distance between the peak 312 of the band diagram 410 and the top electrode 304 is also too small. These factors cause the leakage current to be too high in this type of selector device without modification. The embodiments described herein solve this and other problems by introducing new device characteristics, designs, materials, and fabrication processes that shift the rise in leakage current to the right in graph 600. This allows small voltages to be applied to the device without increasing the leakage current significantly to the level shown in FIG. 6.

An additional problem with the memory device described above is that the voltage level required to cause the movement of ions from one position in active layer to another position is approximately 4 V or higher, as illustrated by voltage 608 in graph 600. The embodiments described herein also shift the peak voltage 608 required to move ions in the device to the left (e.g., to lower voltages), thus compressing the clockwise and counterclockwise voltage path illustrated in the graph 600. This allows the device to be fully operated with lower voltage levels, thus reducing the power required for the memory array or neural network as a whole. While the performance is improved over the devices described in the figures above, this device 500 still has a number of drawbacks that prevent it from being optimal for use in neural networks. Specifically, the device 500 does not exhibit a high degree of selectivity. The current increase is still too abrupt and large as a small amount of voltage is applied across the device, which leads to a large leakage current when devices around the device 500 are activated in the neural network. Additionally, as illustrated in FIG. 6, the upper voltage of the current path is still approximately 4 V, which may be too high for many future low-power memory designs.

Crested Barrier Device

Figure 7A:
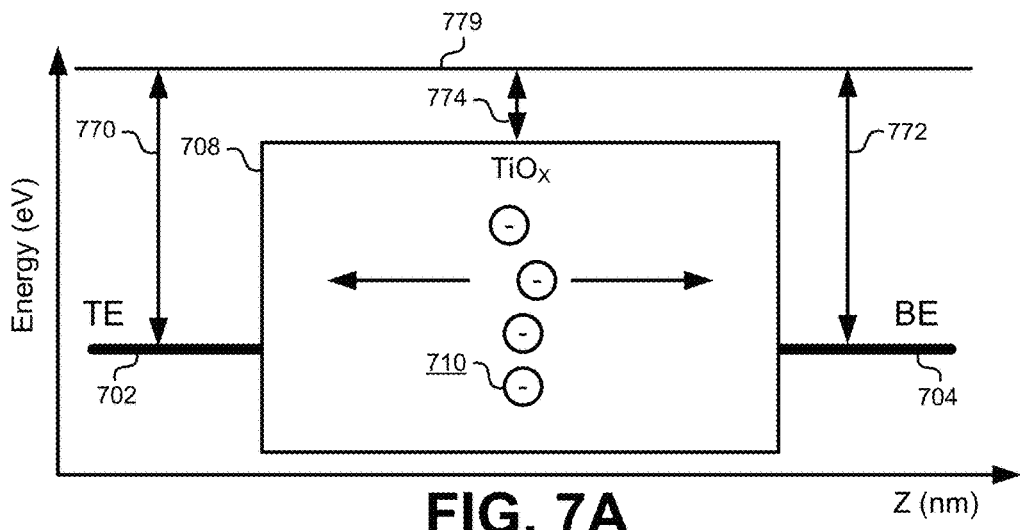
FIG. 7A illustrates a band diagram of a basic nonvolatile memory device comprising an active region, a top electrode, and a bottom electrode.
Figure 7B:
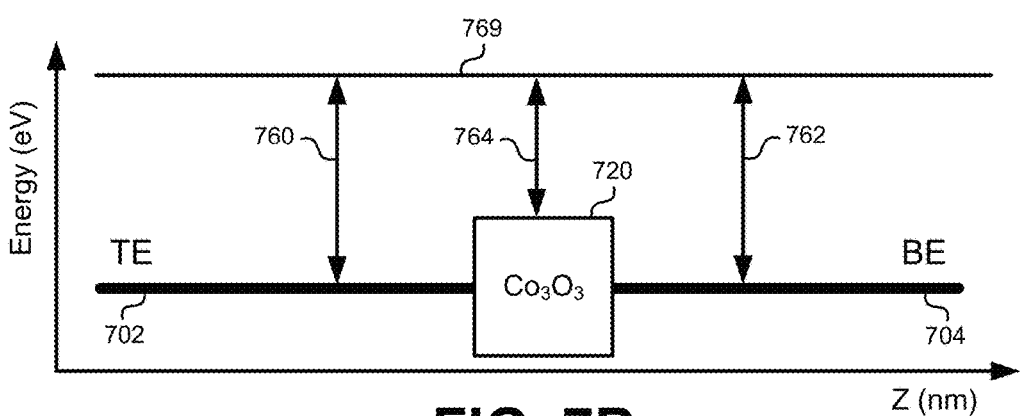
FIG. 7B illustrates a self-rectifying tunneling device or selector, according to some embodiments.

To solve these and other problems, some embodiments may combine the barrier layer 506 and the active layer 508 into a single layer that acts as both a barrier and an active layer simultaneously. FIG. 7A illustrates a band diagram of a basic nonvolatile memory device comprising an active region 708, a top electrode 702, and a bottom electrode 704. As described above, moving ions modulate the conduction and valence band offsets and dielectric transparency (i.e., the tunneling probability) as a way to store a state in the active layer 708. When a voltage is applied across the device, a ions (or any other mobile species) move or drift from one location in the active region to another location. The position of the ions (or any other mobile species) may be precisely determined by an external voltage to a desired position within the active layer for precisely tuning the conductance. In turn the level of conductance in the device may be used to store one or more logic levels as a memory. FIG. 7B illustrates a dielectric tunneling device with high electron affinity (e.g., higher than 4 eV), according to some embodiments. This layer may have an affinity that is higher than the active layer with a lower dielectric constant. The dielectric device includes a tunneling layer 720 comprising a low bandgap material with a high electron affinity and relatively low dielectric constant. Some embodiments may use a material such as cobalt oxide ($CO_3O_4$).

Figure 7C:
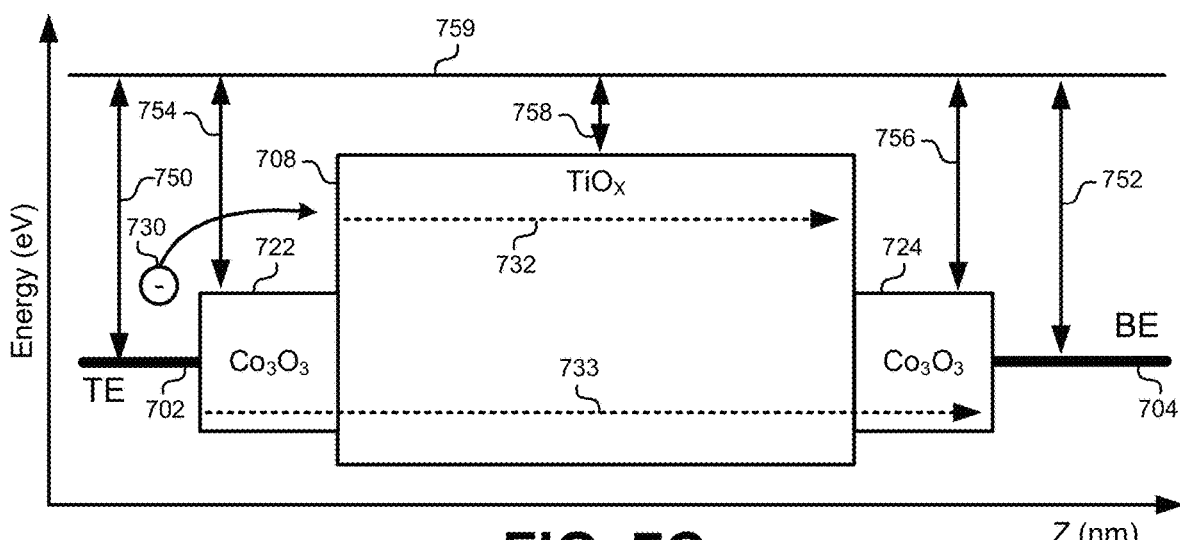
FIG. 7C illustrates a combination of an active layer and two self-rectifying, tunneling layers to form a crested-barrier device, according to some embodiments.

FIG. 7C illustrates a combination of an active layer 708 and two high-affinity, relatively low-k tunneling layers 722, 724 to form a crested-barrier device, according to some embodiments. This combined device includes a tunneling self-rectifying layer 722 between the top electrode 702 and the active layer 708. The combined device also includes a tunneling layer 724 between the bottom electrode 704 and the active layer 708. Note that the energy bands of tunneling layer 722 and tunneling layer 724 are substantially less than the energy band of the active layer 708. The cobalt oxide in the tunneling layers 722, 724 takes the place of the amorphous silicon self-rectifying layer in the device illustrated in FIG. 5A, and the active layer 708 is extended in place of the barrier layer of silicon dioxide. In comparison, the tunneling layers 722, 724 provide an energy band that is significantly less than the energy band of the active layer 708. The difference between these two energy bands forms a tunneling barrier that keeps electrons from tunneling between the top electrode 702 and the bottom electrode 704 without a sufficient voltage being applied. Some embodiments may also include additional high-affinity layers (i.e., having a higher affinity than active layer) between the tunneling layer 722 and the active layer 708, or between the active layer 708 and the tunneling layer 724. The bandgap energies of these additional layers may fall between the bandgap energy of the tunneling layers 722, 724 and the active layer 708.

For example, as an electron 730 enters the conduction band of the tunneling self-rectifying layer 722, it will be stopped by the relatively large energy band and thickness of the active layer 708. This energy band forms a barrier over which the electron 730 must proceed in order to get to the bottom electrode 704. The energy band of the active layer 708 may be overcome by applying a voltage sufficient to lift the energy of the electron 730 over the energy band of the active layer 708. Tunneling through the barrier of the active layer 708 is unlikely given the magnitude of the energy band of the active layer 708 compared to the energy of the electron 730 in the self-rectifying tunneling layer 722. Essentially, this difference between the energy band levels of the tunneling layers 722, 724 and the active layer 708 acts as a barrier to replace the large silicon dioxide barrier found in previous devices. Furthermore, the dielectric constant of the tunneling layers 722, 724 may be significantly lower than the dielectric constant of the active layer 708 as described below. The difference between the conduction band offsets may be at least 0.7 eV (the electron affinity of the tunneling self-rectifying layers may be higher), while the valence band offset may be relatively small or even negative. For example, holes may see a barrier when tunneling from the active layer to the tunneling oxide. Thus, the valence band of tunneling layer may be energetically lower compared to valence band of active region.

Examining the energy bands of FIG. 7C reveals a number of distinct advantages provided by this device. First, in the absence of an applied voltage, the tunneling distance 733 for an electron at the top electrode 702 and/or the bottom electrode 704 corresponds to the width of the tunneling layer 722, the active layer 708, and the tunneling layer 724. There are no areas where the energy bands skew up or down to leave small tunneling distances available to the electron. Second, the device is fairly symmetrical. This allows provides large tunneling distances for electrons at both the top electrode 702 and the bottom electrode 704. This also allows voltages to be applied in either direction, making the device itself bidirectional. Third, the devices described above in FIG. 5A have a relatively large barrier layer of silicon dioxide with a low dielectric constant that amortizes the largest part of the voltage drop. This large barrier requires large voltages, to overcome the voltage divider in order for electrons to conduct through the device. As illustrated in FIG. 6, full conduction in the device required a voltage of approximately 4 V-5 V. However, by relying on the difference between the energy bands of the tunneling self-rectifying layers 722, 724 and the energy band of the active layer 708 to form a barrier, this voltage may be reduced. For example, the operating voltage required for an electron to move over the energy band of the active layer 708 may be considerably less, such as approximately 2 V-2.5 V rather than approximately 4 V-5 V. This reduces the power required to operate the crested barrier memory/selector device by as much as 50%. This reduction in power is particularly important given the exponential growth of data storage. Currently, approximately 7% of our available energy supply goes to powering data storage centers used by social media, search engines, and other online data storage services. Reducing the operating voltage by 50% may dramatically reduce the overall power requirements of data storage centers around the world.

The drop in operating voltage for the crested barrier device may be understood in comparison to the device of FIG. 5A. In FIG. 5A, the barrier layer of silicon dioxide has a relatively low dielectric constant but a comparatively high bandgap energy 524. This required a large voltage drop to overcome the amorphous silicon layer 504 and the silicon dioxide layer 506 before electrons even encountered the active layer 508. By removing the large barrier layer 506 and instead allowing the active layer 708 to act as a barrier in comparison to the tunneling layers 722, 724, the total voltage drop required before arriving at the active layer 708 may be substantially reduced.

One way to characterize the crested barrier device in FIG. 7C is by the relative dielectric constants of each of the different layers. In some embodiments, the dielectric constant of the active layer 708 may be a multiple of the dielectric constant of the tunneling layers 722, 724. For example, using the cobalt oxide, titanium oxide, cobalt oxide device of FIG. 7C, the dielectric constants of the tunneling layer 722, 724 would typically range between approximately 13 and approximately 17. In comparison, the dielectric constant of the active layer 708 would range between approximately 30 and approximately 60. Thus, the dielectric constant of the active layer 708 may be at least approximately 1.5 or 1.7 times as large as the dielectric constant of the self-rectifying layers 722, 724. In some embodiments, the dielectric constant of the active layer 708 may be any value between approximately 1.5 and 2.0 times greater, approximately 2.0 and 2.5 times greater, approximately 2.5 and 3.0 times greater, approximately 3.0 and 4.0 times greater, approximately 4.0 and 5.0 times greater, approximately 5.0 and 6.0 times greater, approximately 6.0 and 7.0 times greater, approximately 7.0 and 8.0 times greater, approximately 8.0 and 9.0 times greater, approximately 9.0 and 10.0 times greater, and/or more than a proximally 10 times greater. Each of these ranges provides specific benefits to the electrical characteristics of the device.

In addition to characterizing the active layer 708 in comparison to the tunneling layers 722, 724 by differences in the dielectric constants, some embodiments may also characterize the active layer 708 by comparing the relative electron affinity between the active layer 708 and the tunneling layers 722, 724. For example, for an active layer of TiOx, the electron affinity will be approximately 3.4 eV to 4.0 eV. In comparison, the $Co_3PO_4$ used in the tunneling layers 722, 724 may have an electron affinity of approximately 4.8 eV-5.5 eV. Generally, the electron affinity of the tunneling layers 722, 724 may be higher than the electron affinity of the active layer. In some embodiments, the electron affinity of the tunneling layers 722, 724 may be greater than 4.8 eV, while the electron affinity of the active layer 708 may be less than approximately 4.0 eV. Some embodiments may also tune the electron affinity and alignment of the various energy bands by doping the active layer TiOx with other materials, such as C, Cr, Mo, W, C, N, Nb, Ta, Zr, Hf, S, Se, P, and/or the like.

In another embodiment, the tunneling layers 722, 724 may be replaced with amorphous silicon or $MnO_3$ or $CrO_3$ or $V_2O_5$, $WO_3$, $NiO$, $Cr_2O_3$, $SnS_2$, or any other high-affinity, small-bandgap oxide, rather than cobalt oxide. Moreover, by alloying using different materials new tunneling barriers can be engineered as described below. In these embodiments, the dielectric constant of the tunneling layers 722, 724 may be lowered to approximately 4. As described above, the dielectric constant of the active layer 708 using titanium oxide is approximately 30 to approximately 60. In this embodiment, the dielectric constant of the active layer 708 may be between approximately 7 times greater and 15 times greater than the dielectric constant of the tunneling layers 722, 724.

In another embodiment, titanium oxide may be used as the tunneling layers 722, 724. However, a different form of crystal lattice for the titanium oxide may be used such that the dielectric constant of the tunneling layers 722, 724 is approximately 25. The crystal lattice of the titanium oxide can come in various forms depending on its phase and how it is grown. Depending on the crystal lattice and the phase, the dielectric constant of different forms of titanium oxide can range from 12-100. In this embodiment, the titanium oxide has a much lower dielectric constant and does not act as an active layer. Instead, doped hafnium oxide may be used as the material for the active layer 708, which has a dielectric constant of approximately 40. In these embodiments the dielectric constant of the active layer 708 may be between approximately 1.5 and approximately 2.5 times greater than the dielectric constant of the active layer which in turn can reduce the operating voltage even more.

In some embodiments, TiOx may be used as an active layer, and alloying different materials may be used to create a tunneling layer. Alloying may include the direct chemical combination of different oxides. The combination of a few high-affinity oxides may be used to create a tunneling layer while maintaining the crested barrier shape illustrated in FIG. 7C.

Although FIG. 7C illustrates the tunneling layers 722, 724 to be directly adjacent to the active layer 708, this is provided only by way of example and is not meant to be limiting. In other embodiments, additional layers may be present between the tunneling layers 722, 724 and the active layer 708.

In some embodiments, different materials for the top electrode and the bottom electrode may be used such that there is a work function differential between the two electrodes. The work function of a metal electrode is similar to, or higher than the electron affinity for the tunneling layer and other layers in the device. In other words, the work function of the metal electrode corresponds to the amount of energy required for an electron to break free of the material and ionize to the vacuum energy level.

For example, the top electrode 702 may be constructed by depositing a layer of platinum. Instead of using a layer of platinum for the bottom electrode 704, the bottom electrode 704 may be formed using a different material having a different work function. In this example, the bottom electrode 704 may be constructed by depositing a layer of titanium nitride, which has a work function that is less than the work function of the top electrode 702 made of platinum. This creates a differential between the two work functions that may be balanced by shifting the energy bands of the other layers in the band diagram 800. For example, if the work function of the bottom electrode 704 is 4.6 eV, and the work function of the top electrode 706 is 5.6 eV, and the length of the tunneling layers 722, 724 and the active layer 708 are approximately 10 nm, this work function differential will generate an electric field of 1.0 MV/cm across the device. Because the natural state of the device will tend to pull the potential of both electrodes to the same level (e.g., 0 V), the rest of the band diagram may tend to bend to create this equilibrium. This workfunction differential may be used for tuning the position of the lobe described in FIG. 12 to accommodate any design rules. This may also be used to tune the read-voltage and ON/OFF ratio of the device and to tune the self-rectification (and leakage) of the device.

Creating a work function differential between the top electrode 702 and the bottom electrode 704 affects the operation of the crested barrier device in a number of ways. First, this induces an electric field across the device 900 in order to maintain 0 V at both electrodes 702, 704. This induced electric field can require additional voltage to be applied to the device before it begins to conduct. The applied voltage may need to first overcome the induced electric field before conduction begins. Thus, at the low voltage levels typically seen in memory arrays or in neural networks, the device will not begin to conduct the relatively high levels of leakage current illustrated in FIG. 6 until, for example, more than 1 V is applied across the device. This shifts the voltage levels where leakage currents occur to be above the voltage levels that are incidentally seen in a neural network when selecting nearby devices. This dramatically reduces the leakage current experienced in neural networks and memory arrays.

In addition to inducing an electric field, the work function differential between the bottom electrode 704 and the top electrode 702 may also cause the ions 710 in the active layer to move to one side of the active layer 708. The magnitude of the leakage current is at least partially dependent on the position of the ions 710. The induced electric field creates an internal bias in the device that delays the movement of the ions 710 to the towards the opposing electrode. This delay keeps the leakage current low until a higher voltage is applied. In some embodiments, a work function difference of at least 0.2 eV may be used between the top and bottom electrodes. In other embodiments, the work function difference may be approximately 0.2 eV-0.5 eV, approximately 0.3 eV-0.6 eV, and so forth. Differentials greater than 0.6 eV may lose memory retention as the field generated may be strong enough that even at 0 V applied, the ions may be pushed completely to the other side of the device.

FIGS. 8-11 illustrate plots of the energy band diagrams for different states as a voltage is initially applied to the device. FIG. 8A illustrates a voltage and current diagram similar to that of FIG. 6. For this embodiment, the active layer may have a dielectric constant of approximately 40. The bandgap energy of the active layer may be between 2.6 and 3.4 eV, and the electron affinity of the active layer may be approximately 3.2 eV-4.3 eV or higher. The work function of the bottom electrode may be approximately 5-5.6 eV, and the work function of the top electrode may be approximately 4.8-5.4 eV. The doping of the active layer may be approximately 1e 20 cm$^{-3}$ (e.g., oxygen ion doping in the TiOx) to adjust an existing amount of oxygen in the layer. The width of the active layer is approximately 10 nm, and the width of each of the self-rectifying layers is approximately 1.5 nm.

Figure 8A:
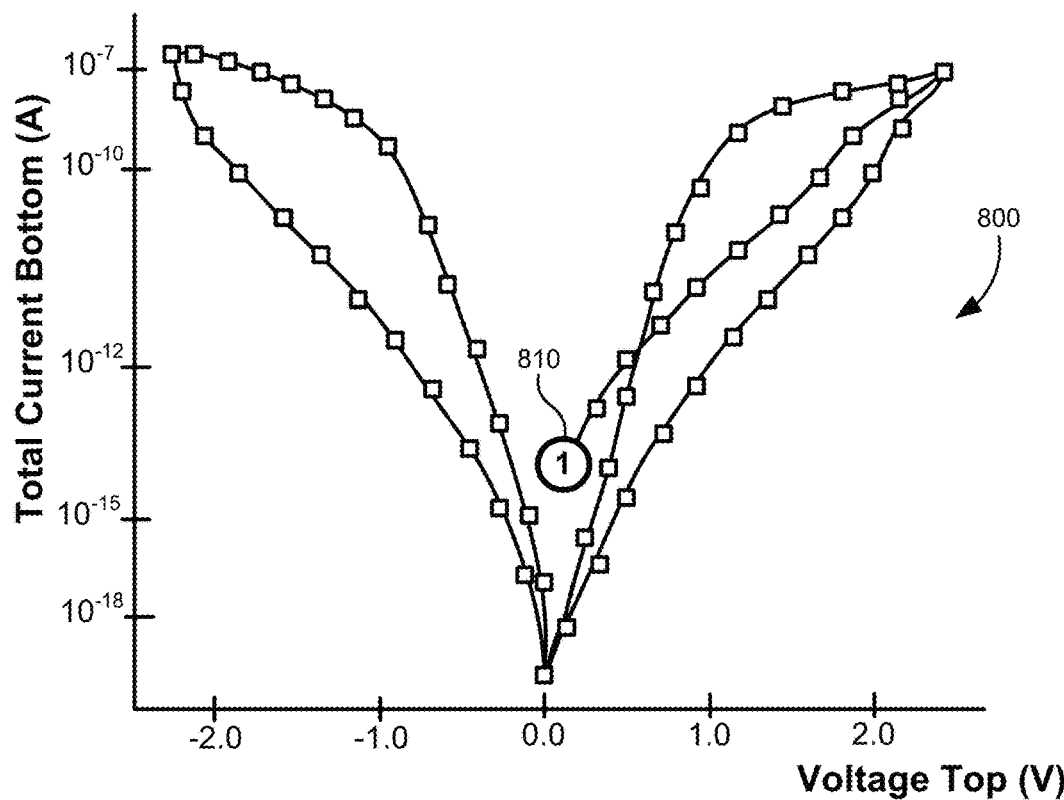
FIG. 8A illustrates a voltage and current diagram similar to that of FIG. 6.
Figure 8B:
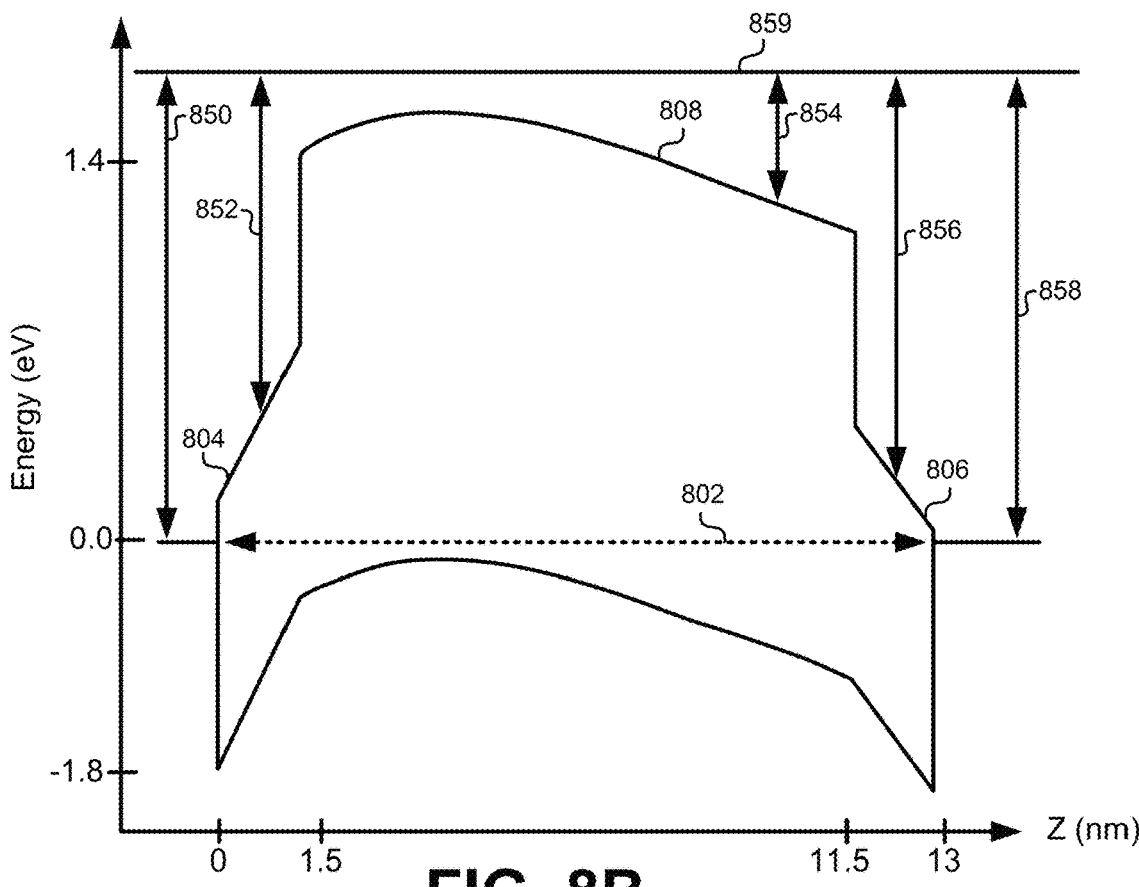
FIG. 8B illustrates an energy band diagram of the device when approximately 0 V are applied.

The advantages of the crested barrier device are evident in these diagrams. First, the operating voltage of the device is reduced to approximately 2.6 V when fully conducting. Additionally, the leakage current at less than 0.5 V is very small in comparison to other devices. When a voltage is initially applied to the device, the device begins conducting at location 810 in graph 800 of FIG. 8. FIG. 8B illustrates an energy band diagram of the device when approximately 0 V are applied. Notice that the band diagram formed itself such that the two electrodes are at an equilibrium voltage as described above in response to the work function differential between the two electrodes. The work function differential may be generated by virtue of using different materials for the top electrode and the bottom electrode. In comparison to the band diagram in FIG. 7C, the energy bands 804, 806 of the self-rectifying layers 722, 724 are both skewed upward, while the energy band 800 for the active layer 708 changes shape to maintain equilibrium between the top electrode and the bottom electrode. At this point, the tunneling length 802 is still very large across the device. This prevents most leakage current from occurring until more voltage is applied.

Figure 9A:
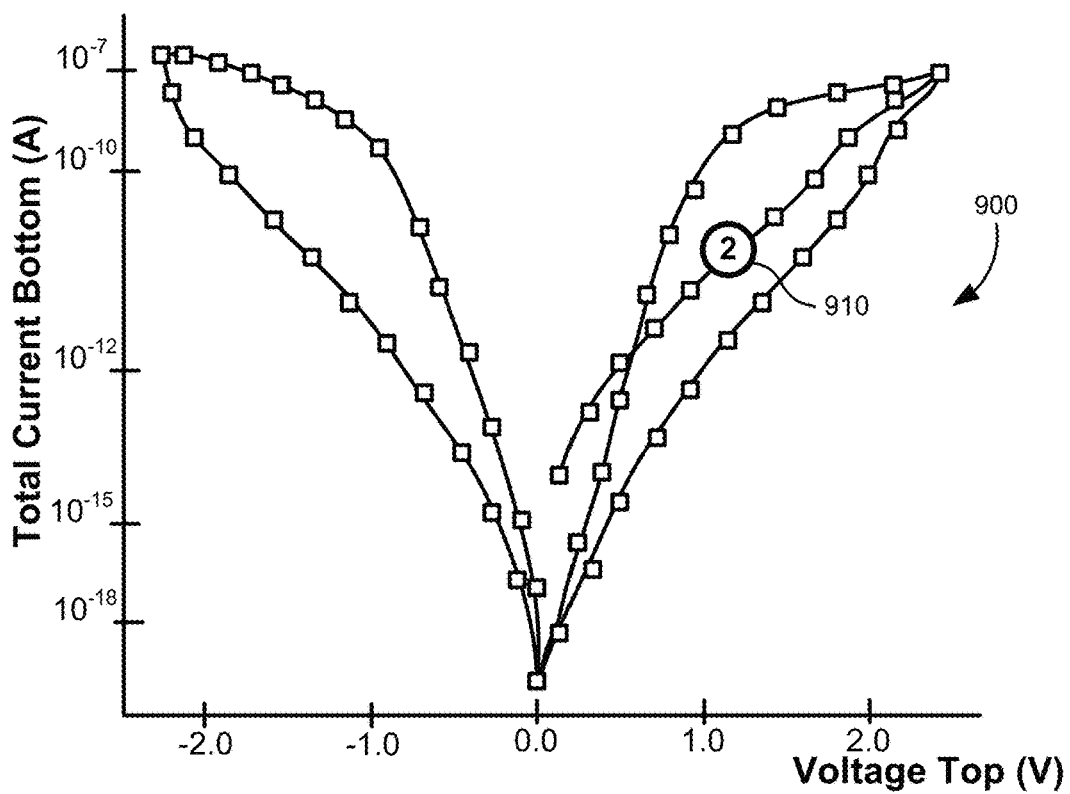
FIG. 9A illustrates a voltage and current diagram when a voltage has been applied to the device at a position.
Figure 9B:
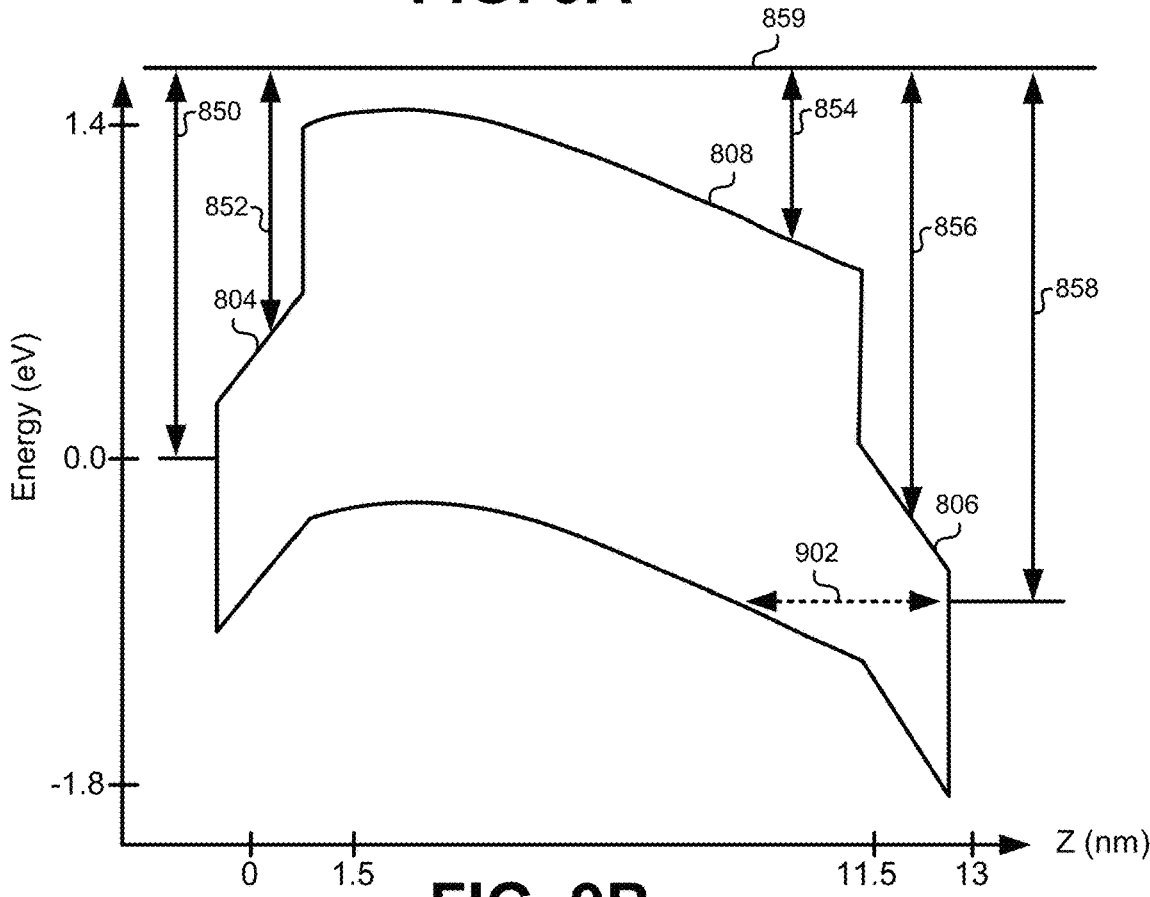
FIG. 9B illustrates an energy band diagram of the device when approximately 1 V has been applied.

As the device begins to conduct, the ions (or any other mobile species) will move to one side according to the direction of the voltage applied. FIG. 9A illustrates a voltage and current diagram when a voltage has been applied to the device at position 910. At this stage, current begins to flow through the device at significant levels. FIG. 9B illustrates an energy band diagram of the device when approximately 1 V has been applied. Notice that the tunneling length 902 is significantly smaller, resulting in more current flowing through the device. Also notice that the applied voltage has skewed the band diagram such that there is an energy differential between the top electrode and the bottom electrode.

Figure 10A:
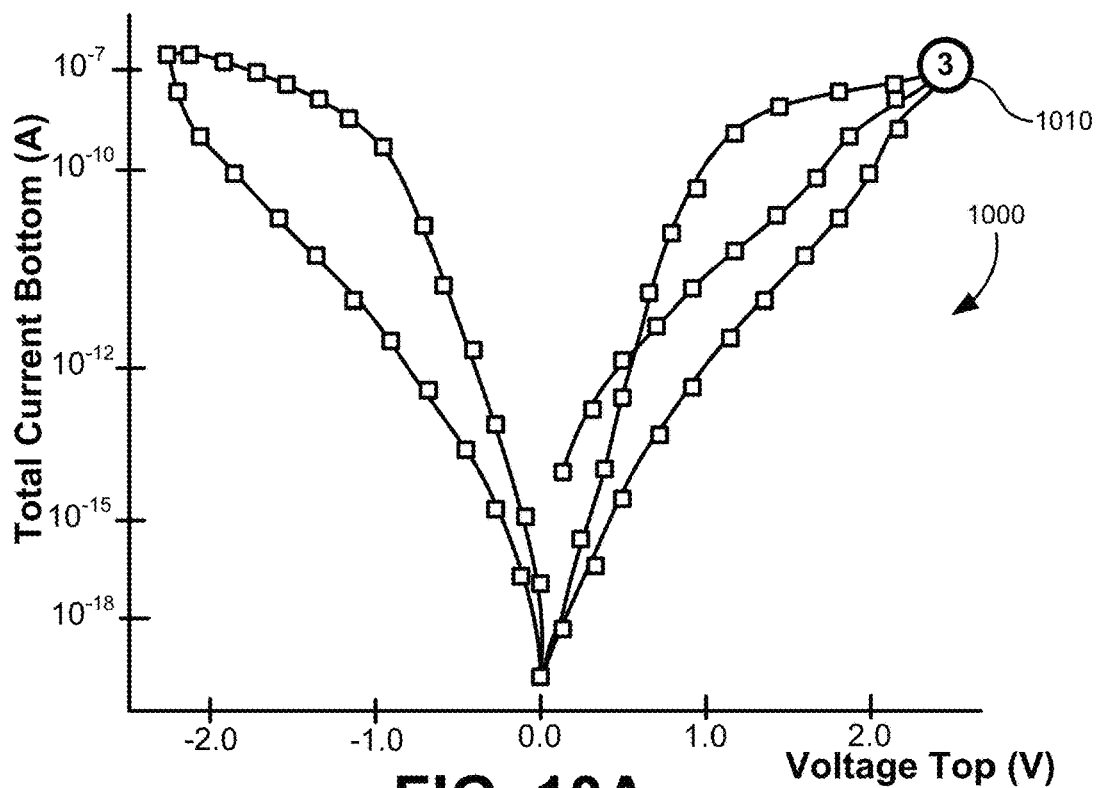
FIG. 10A illustrates a voltage and current diagram when the device is fully conducting.
Figure 10B:
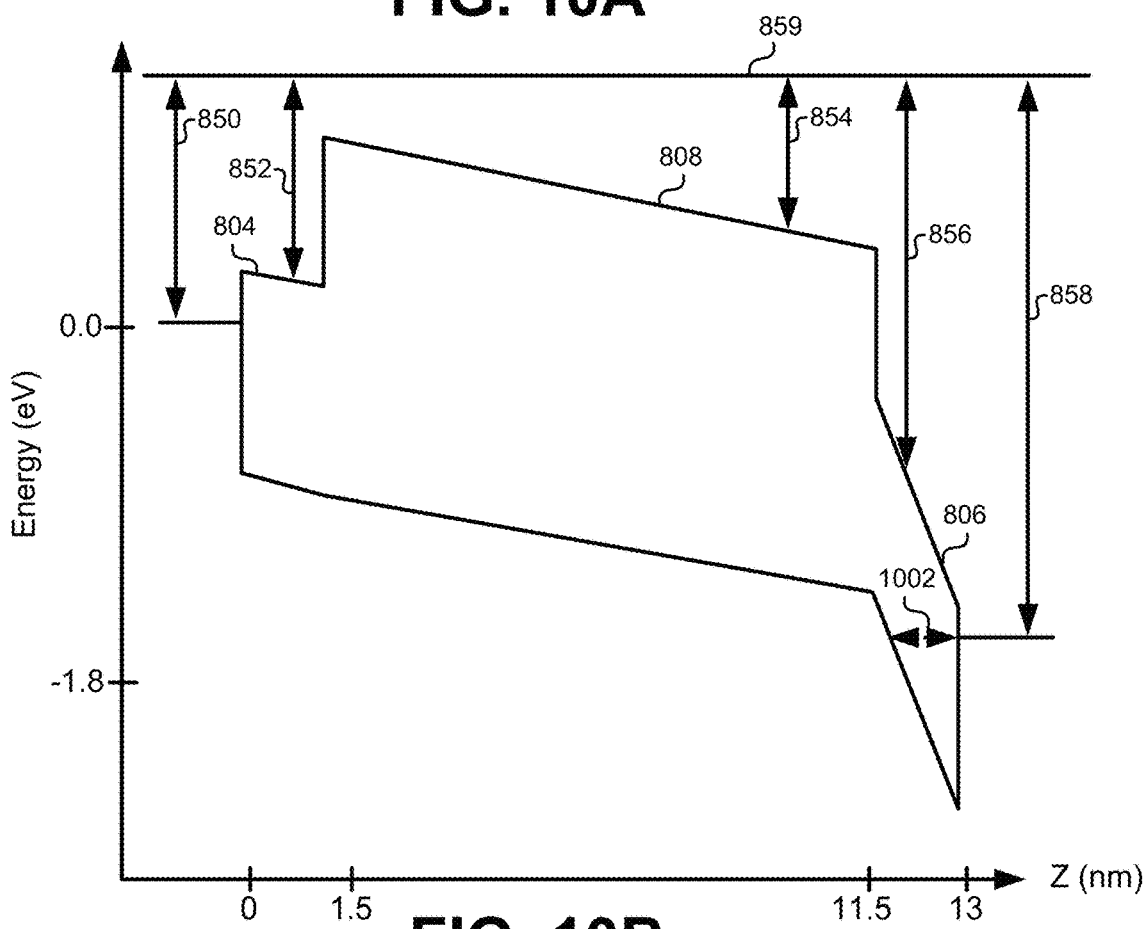
FIG. 10B illustrates an energy band diagram of the device at position on the voltage and current diagram.

FIG. 10A illustrates a voltage and current diagram when the device is fully conducting. At position 1010, approximately 2.6 V have been applied to the device, and the current flow has been maximized through the device in response. FIG. 10B illustrates an energy band diagram of the device at position 1010 on the voltage and current diagram. Note that the tunneling length 1002 is substantially smaller than at other levels, causing an increased amount of current to flow through the device at this level. Also note that the band diagram has continued to skew based on the applied voltage, resulting in a larger energy differential between the top electrode and the bottom electrode.

Figure 11A:
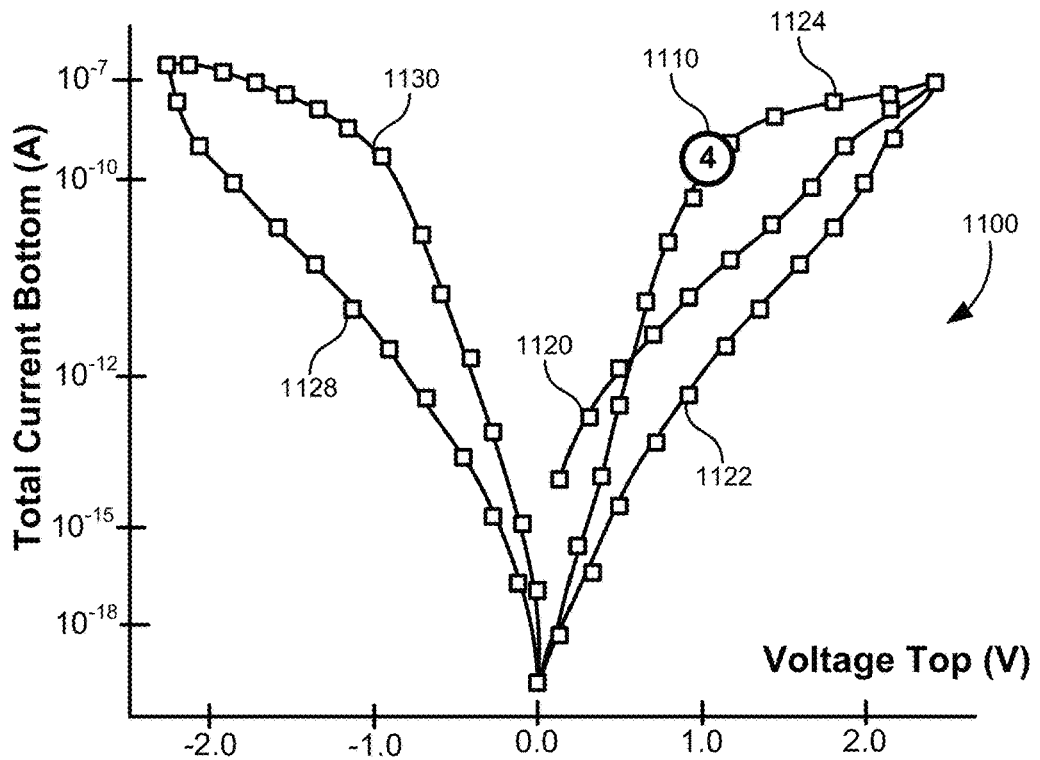
FIG. 11A illustrates a voltage and current diagram as the current and voltage begins to decrease in the device.
Figure 11B:
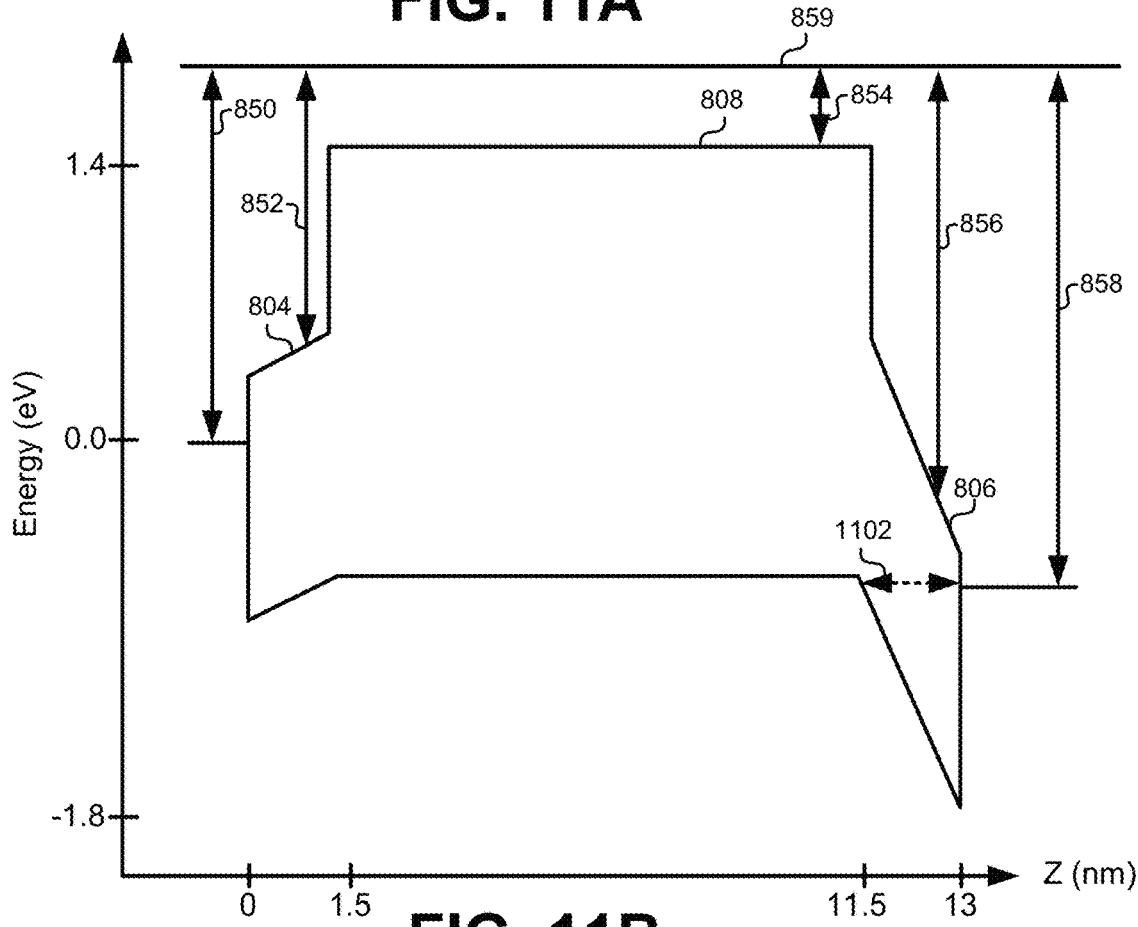
FIG. 11B illustrates the band diagram as the voltage is removed from the device.

FIG. 11A illustrates a voltage and current diagram 1100 as the current and voltage begins to decrease in the device. Note the counterclockwise (CCW) behavior of the device such that there is a difference between currents at the same level depending on whether the device is turning on or turning off. This provides a level of selectivity to the device, and this difference is greater in the crested barrier device in comparison to other devices, resulting in a higher selectivity. The difference between the paths in the CCW loop at the same applied voltage may be tuned based on the relative thickness of the tunneling layers and the active layers. FIG. 11B illustrates the band diagram as the voltage is removed from the device. The tunneling length 1102 is reaching a point where it is about to dramatically increase across the device. As the voltage is lowered, the voltage and current diagram 1100 shows an abrupt decreasing current as a small amount of voltage is removed from position 1110. This rapid turn off of the device results in less leakage current after the voltage is reduced to below approximately 1 V.

FIG. 11A also illustrates the clockwise (CW) and CCW characteristics of the device. As described above, the device is approximately symmetrical. As a negative voltage is applied across the device, the CW paths for the current/voltage may be followed on the left half of the voltage and current diagram 1100. For example, the decreasing voltage may follow CW path 1128 until the device fully conducts in the other direction, and then follow CW path 1130 as voltage is removed from the device. If a positive voltage is again applied to the device, the voltage and current will follow CCW path 1122 until the device fully conducts, then follow CCW path 1124 as voltage is removed from the device. Path 1120 is likely only to be followed when a voltage is initially applied to the device and the ions are resting approximately in the middle of the active layer. For the negative voltages applied across an opposite direction of the device resulting in the CW paths on the left side of the graph, the energy band diagrams in FIG. 8B, FIG. 9B, FIG. 10B, and FIG. 11B may be reversed to show approximately the same behavior in the opposite direction.

The examples described above apply a single voltage across the device to illustrate the behavior of the device. However, these embodiments are also fully functional when voltage pulses are applied to the device instead of or in addition to constant voltages. The progression around the various CW and CCW voltage and current pathways illustrated in FIG. 11A also apply when individual voltage pulses are provided to the device. For example, a first voltage pulse may be applied that is sufficient to move the state of the device from position 810 in FIG. 8A to position 910 in FIG. 9A. The state of the device may stay in position 910 until a second set of one or more pulses is provided to the device to move to position 1010 in FIG. 10A. Multiple pulses may be provided in a memory array or neural network to model the behavior of neurons and synapses, making this crested barrier device an ideal self-rectifying and self-limiting memory element for such applications.

Figure 12:
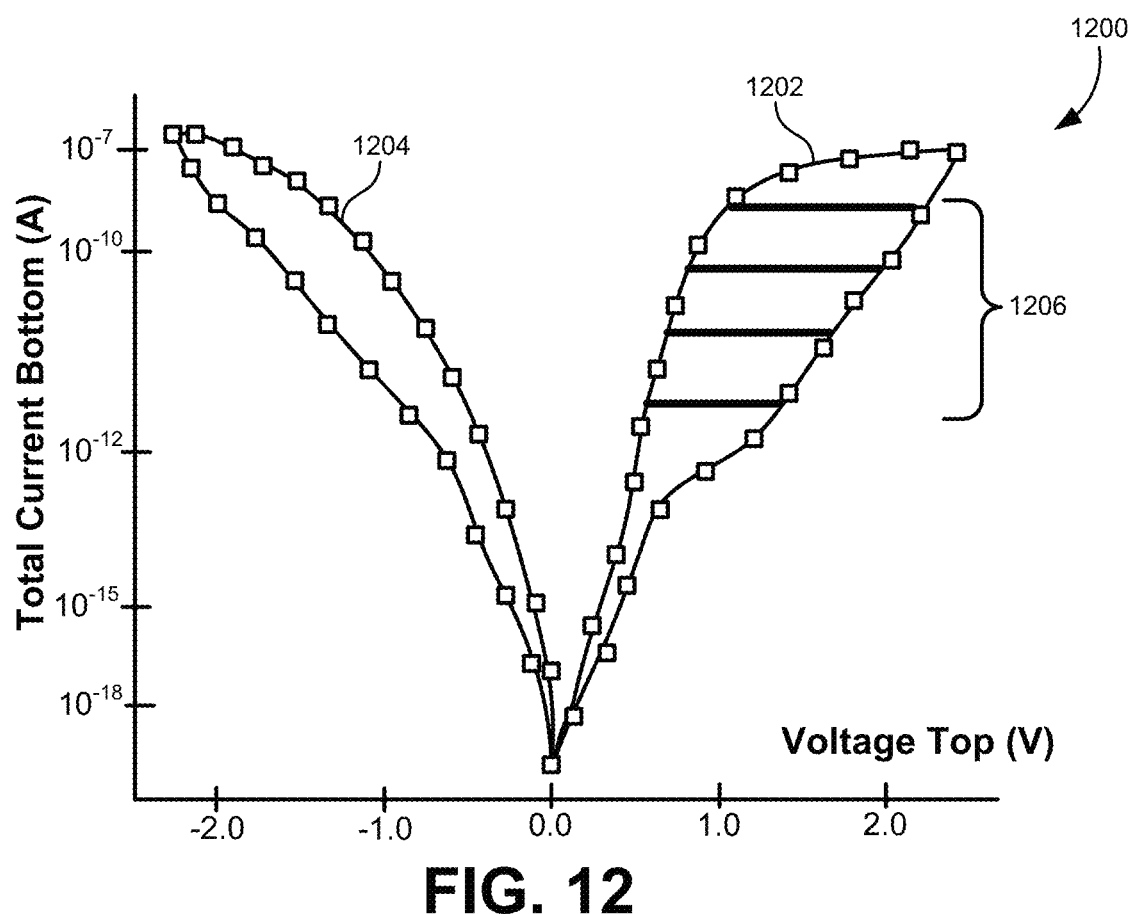
FIG. 12 illustrates a graph of how the selectivity of a crested barrier device may be adjusted by increasing the work function differentials between the two electrodes, according to some embodiments.

FIG. 12 illustrates a graph 1200 of how the selectivity of a crested barrier device may be adjusted by increasing the work function differentials between the two electrodes, according to some embodiments. As part of this disclosure, increasing the work function differential between two electrodes has been discovered to increase the size of one of the "lobes" in the current/voltage diagram. For example, when the work function of the top electrode is greater than the work function of the bottom electrode, the lobe 1202 that results from a positive voltage being applied to the device increases in size. Additionally, the lobe 1204 that results from a negative voltage being applied to the device decreases in size, becoming narrower. Therefore, the work function differential may be used to tune the amount of selectivity desired for each side of the current/voltage response. Additionally, some embodiments may create a larger work function on the bottom electrode in comparison to the top electrode. In these embodiments, the lobe 1204 resulting from a negative voltage would become larger and the lobe 1202 resulting from a positive voltage would become smaller and narrower.

More selectivity makes the crested barrier device ideal for large arrays, and increasing of the lobe and ON/OFF ratio makes it ideal for multi-state memory implementations. When the lobe 1202 is large enough, multiple states 1206 may be readily distinguished in the lobe 1202. Instead of simply providing a binary 0/1 set of states for a traditional binary memory. Some embodiments may include a plurality of states 1206 in between the 0/1 states at both ends of the lobe 1202. As described above, because the device is responsive to individual voltage pulses, predetermined voltage levels may be applied to the device to generate a current response at one of the desired intermediate states 1206.

Figure 13:
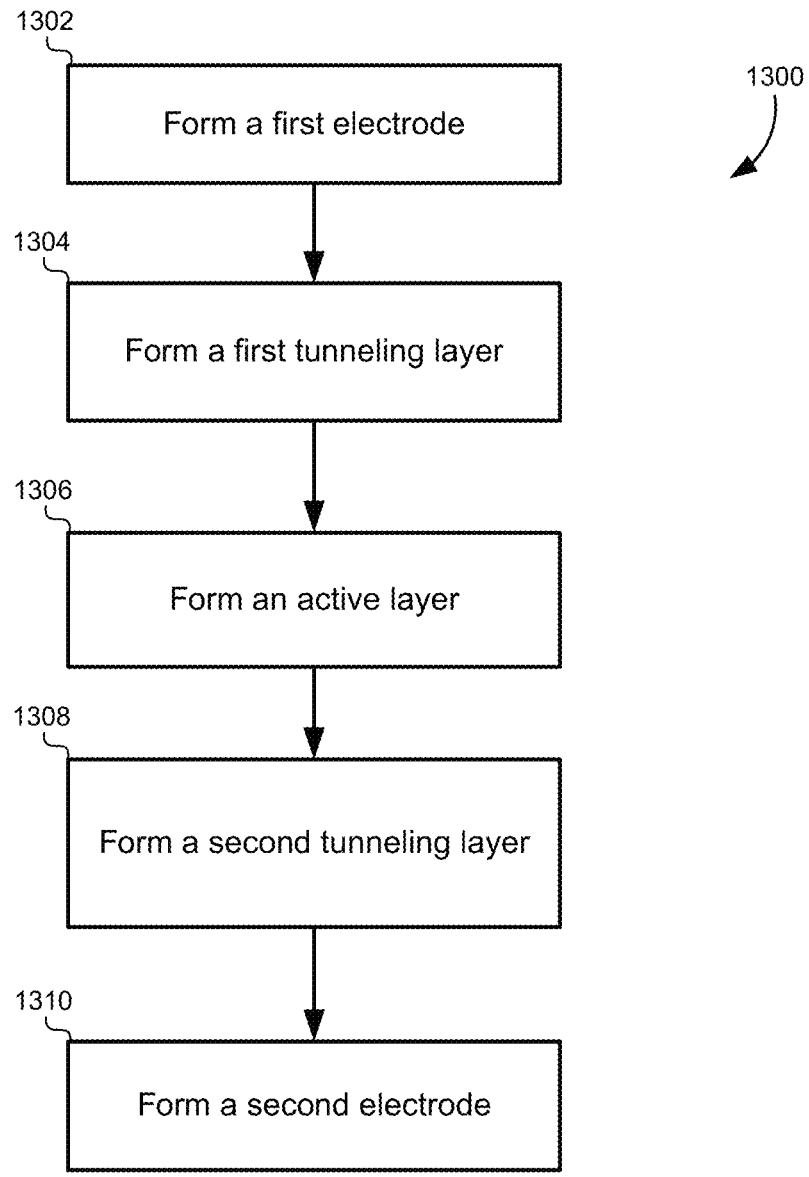
FIG. 13 illustrates a flowchart of a process for manufacturing a crested barrier device, according to some embodiments.

FIG. 13 illustrates a flowchart 1300 of a process for manufacturing a crested barrier device, according to some embodiments. The method may include forming a first electrode (1302). The first electrode may have a work function that is relatively low compared to a work function of a top electrode that will be formed later. The first electrode may have a work function of between approximately 4.9 eV and 5.3 eV. For example, the work function of the first electrode may be between approximately 4.9-5.0 eV, approximately 5.0-5.1 eV, approximately 5.1-5.2 eV, approximately 5.2-5.3 eV, approximately 4.4-4.6 eV, approximately 4.5-4.7 eV, approximately 4.6-4.8 eV, approximately 4.7-4.9 eV, approximately 4.8-5.0 eV, approximately 4.9-5.1 eV, approximately 5.0-5.2 eV, approximately 5.1-5.3 eV, approximately 4.4-4.7 eV, approximately 4.5-4.8 eV, approximately 4.6-4.9 eV, approximately 4.7-5.0 eV, approximately 4.8-5.1 eV, approximately 4.9-5.2 eV, approximately 5.0-5.3 eV, and/or any combination of these approximate ranges. Increasing the work function of the first electrode may increase the on-state conductivity of the device. The first electrode may be deposited using a layer of platinum, and/or any other high-work-function conductive material, such as, IrO, RuO, W, Ir, and/or the like.

The method may also include forming a first tunneling layer (1304). The first tunneling layer may be formed on top of the first electrode. In some embodiments, no intervening layers may be included between the first electrode and the first self-rectifying layer. The first self-rectifying layer may be deposited as a layer of a cobalt oxide, such as $Co_3O_4$. Some embodiments may also use a layer of amorphous silicon or any other high-affinity oxide. Some embodiments may instead use a layer of titanium oxide. Layers of titanium oxide may be used that have a phase and/or crystal lattice that generates a relatively low dielectric constant in comparison to the active layer described below.

The method may also include forming an active layer (1306). The active layer may be formed on top of the first tunneling layer, and may be formed using any known process for forming an active layer. In some embodiments, no intervening layers may be formed between the first tunneling layer and the active layer. Specifically, some embodiments do not include a barrier layer or a layer of silicon dioxide between the active layer and the first self-rectifying layer. The active layer may be formed out of titanium oxide, TaOx/T2O5 oxide or BiFeO3, and may be formed using deposition processes, such as atomic layer deposition (ALD), chemical vapor deposition (CVD), and/or the like. The active layer may be formed to have any of the characteristics described above in this disclosure. For example, the active layer may have its doping controlled to produce at least a minimum dielectric constant. Doping may be controlled by controlling the power with which titanium and/or oxygen are added to a deposition vapor. The active layer may be formed to have a dielectric constant that is at least 1.5 times larger than the first self-rectifying layer. In some embodiments, the active layer may be formed from hafnium oxide. The active layer may be configured to have a phase and crystal lattice structure to provide a dielectric constant that is higher than the dielectric constant of the first self-rectifying layer as described above. Additional comparisons between these dielectric constants are disclosed above.

The method may also include forming a second tunneling layer (1308). The second tunneling layer may be formed on top of the active layer. In some embodiments, no intervening layers may be included between the active layer and the second tunneling layer. The second tunneling layer may be deposited as a layer of a cobalt oxide, such as $Co_3O_4$. Some embodiments may also use a layer of amorphous silicon or any other high-affinity oxide. Some embodiments may instead use a layer of titanium oxide. Layers of titanium oxide may be used that have a phase and/or crystal lattice structure that generates a relatively low dielectric constant in comparison to the active layer described above. A second electrode or top electrode may then be added having a higher work function than the first or bottom electrode (1310) as described above.

Figure 14:
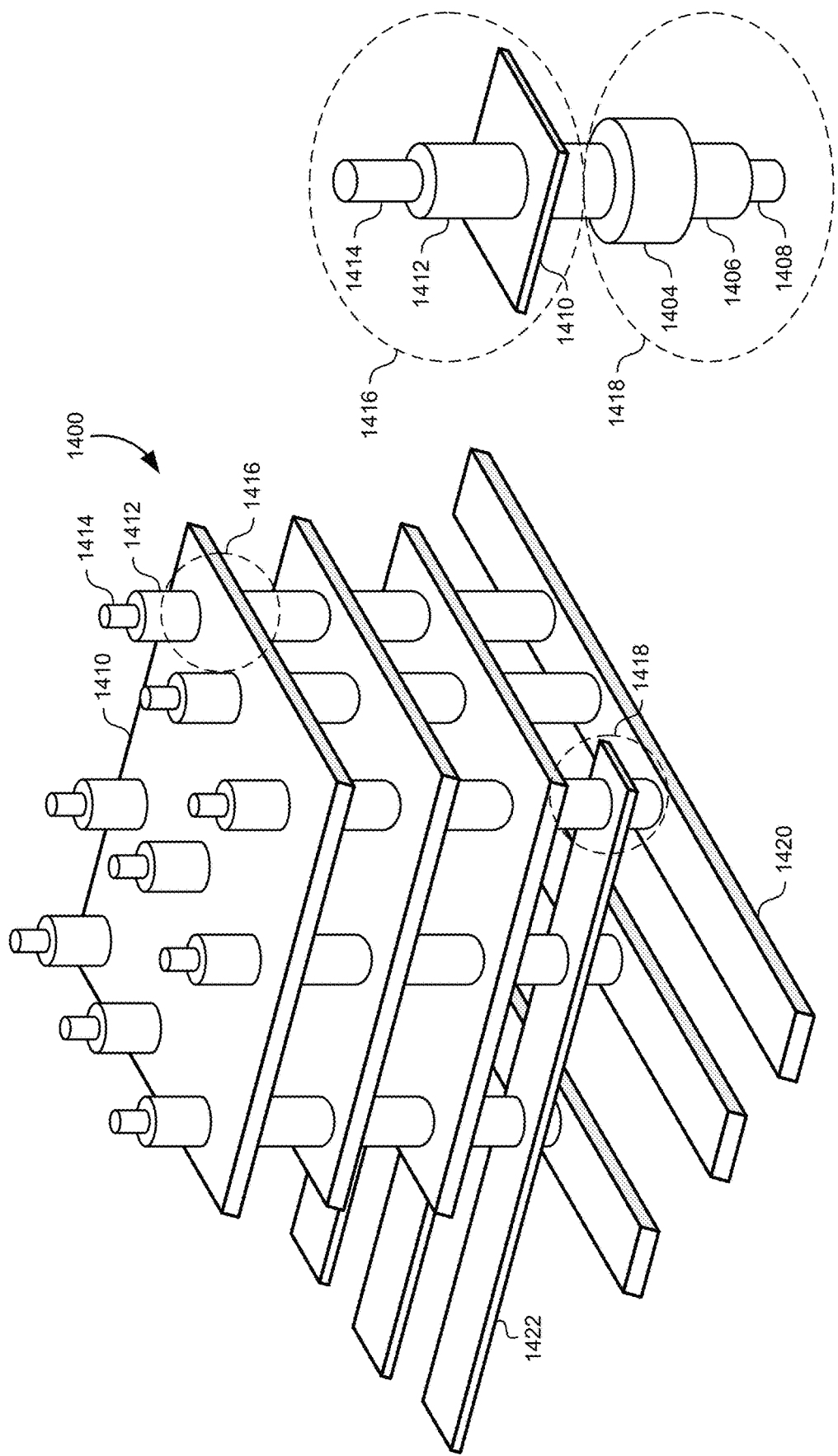
FIG. 14 illustrates a multilayer memory grid that uses crested barrier devices for a memory cell, according to some embodiments.

FIG. 14 illustrates a multilayer memory grid that uses crested barrier devices for a memory cell, according to some embodiments. A crested barrier device 1416 may be implemented using layers of Co3O4/TiOx/Co3O4. For example, cylindrical layers of each of these materials may be layered around a first electrode 1414 passing through the center of the device connected to a plane electrode 1410 on the exterior of the device. The interior layers of the crested barrier device 1416 are not shown explicitly at this level of detail in FIG. 14, however it is clear that they may be implemented as concentric cylinders around the first electrode 1414.

The bottom of the device may also form an access transistor 1418. A gate 1404, a drain 1406, and a source 1408 may be formed using concentric cylinders of material around the interior electrode 1414. A plurality of the crested barrier device 1416 and access transistor 1418 pairs may be combined to form a multi-layer memory grid 1400. Each layer of the grid where a plane electrode 1410 intersects with the crested barrier device 1416 may include concentric layers of Co3O4/TiOx/Co3O4 or similar materials as described above. Select lines 1422 may be connected to the gates 1404 of the access transistors 1418 for each device pair, and bit lines 1420 may be connected to the sources 1408 of the access transistors 1418 of each device pair. The metal plane electrodes 1410 of each layer of the memory grid 1400 may intersect with individual crested barrier devices 1416 comprising layers of Co3O4/TiOx/Co3O4 or other similar materials as described above to act as memory elements.

Crested Barrier Device Materials

As described above, a crested barrier device may be formed using a self-rectifying layer having a relatively low bandgap energy with a combined barrier and active layer having a relatively high bandgap energy. As shown in the example embodiments above, the self-rectifying layer may be implemented using a cobalt oxide material (e.g., $Co_3O_4$), and the combined barrier and active layer may be implemented using a titanium oxide material (e.g., $TiO_x$). Crested barrier devices using these materials allow moving ions to modulate the conduction band offset and dielectric transparency or tunneling probability as a way to store a state in the combined barrier and active layer. This allows the crested barrier device to act as a nonvolatile memory element. In comparison to the combined barrier and active layer, the self-rectifying layer has a low bandgap energy with high electron affinity, and this allows the barrier and active layer to be combined in a single material.

While the titanium oxide and cobalt oxide layers described above may be used to implement crested barrier devices in various embodiments, these materials are provided only by way of example and are not meant to be limiting. This section describes additional specific materials and general classes of materials that may be used to form crested barrier devices that may have an improved memory window or ON/OFF ratio when used as a memory element. Specifically, these materials may improve the retention of the crested barrier device when used as a memory for long time intervals (e.g. up to 10 years). In some embodiments, substitute materials may be used to replace the self-rectifying layer. Separately or in combination, substitute materials may also be used to replace the combined barrier and active layer. These materials open the memory window to increase the stability and improve the long-term retention of the memory device. These replacement materials may be selected using a number of different methods described in detail below. Some materials may be chosen based on their ionic and vacancy diffusion properties, some materials may be chosen such that the combination of the self-rectifying layer and the combined barrier and active layer improves the ON/OFF ratio by adjusting energy band offsets, and some materials may be selected by doping the existing materials in the combined barrier and active layer.

Certain terms are used herein interchangeably. For example, the combined barrier and active layer may be referred to simply as the "active layer" or the "barrier layer" for the sake of simplicity or to refer specifically to one of those two functions of the combined barrier and active layer. Similarly, the self-rectifying layers may also be referred to interchangeably as tunneling layers or self-rectifying tunneling layers.

Figure 15:
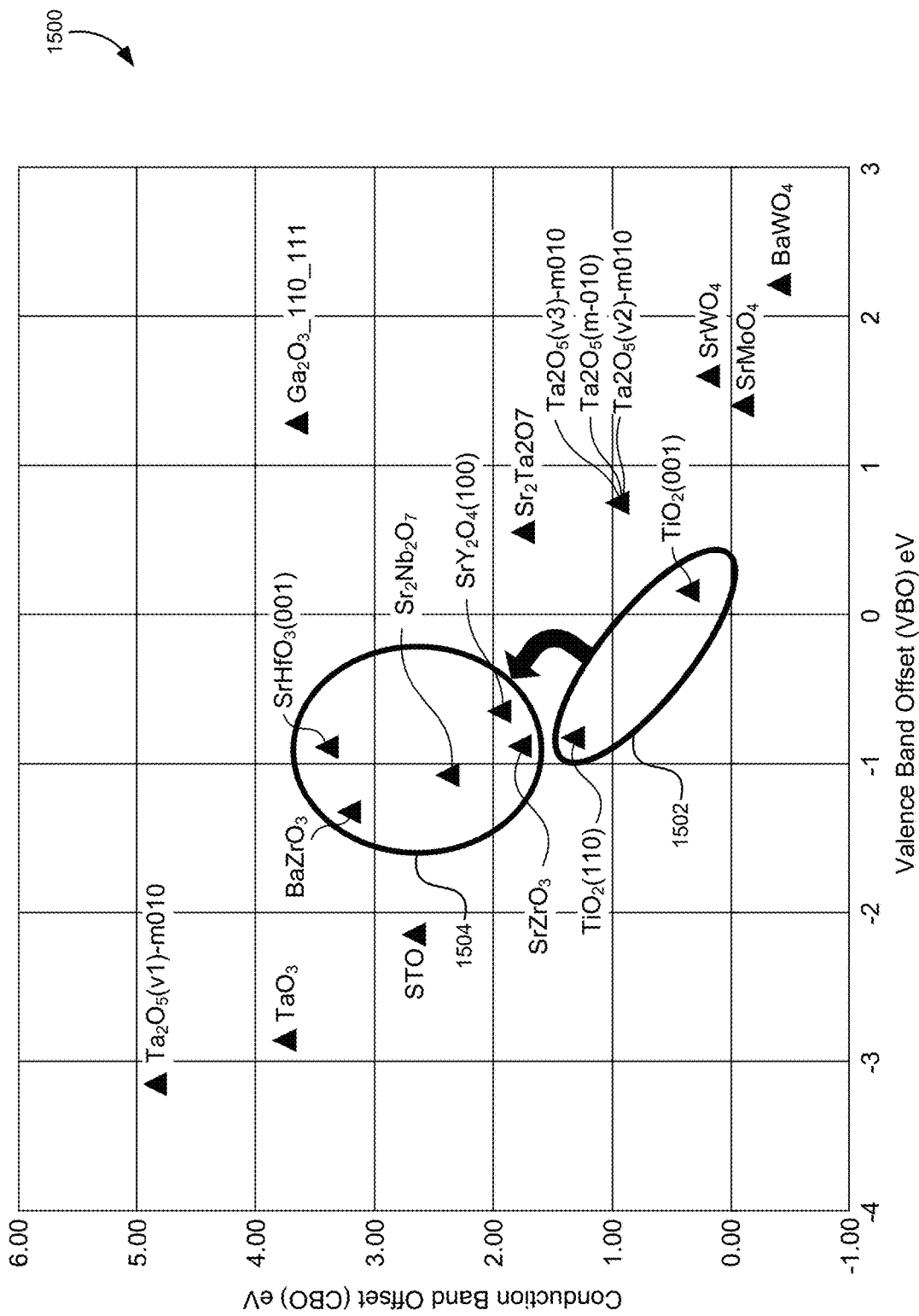
FIG. 15 illustrates a graph of additional materials that may be used in the crested barrier device described above, according to some embodiments.

FIG. 15 illustrates a graph 1500 of additional materials that may be used in the crested barrier device described above, according to some embodiments. This graph 1500 illustrates the conduction band offset (CBO) and valence band offset (VBO) on the y-axis and the x-axis, respectively, for various materials that may be used as substitutes for the titanium oxide in the combined barrier and active layer of the crested barrier device. Some embodiments may also use substitute materials for the self-rectifying layer.

The $Co_3O_4$ material used in the self-rectifying layer may be substituted for various other materials, including $Ga_2O_3$, IGZO and its polymorphs, $Cr_2O_3$, and other similar materials. For example, a crested barrier device using $Ga_2O_3$ as the self-rectifying layer and titanium oxide as the combined active in barrier layer results in a decrease of the VBO by approximately 1.0 eV. Therefore, by way of example, CBO and VBO values for the materials in FIG. 15 that may be substituted for the combined barrier and active layer have been calculated relative to a self-rectifying layer comprised of $Ga_2O_3$. Similar results may be calculated for substitute materials such as $Co_3O_4$, IGZO and its polymorphs, $Cr_2O_3$, and/or other materials.

Figure 16A:
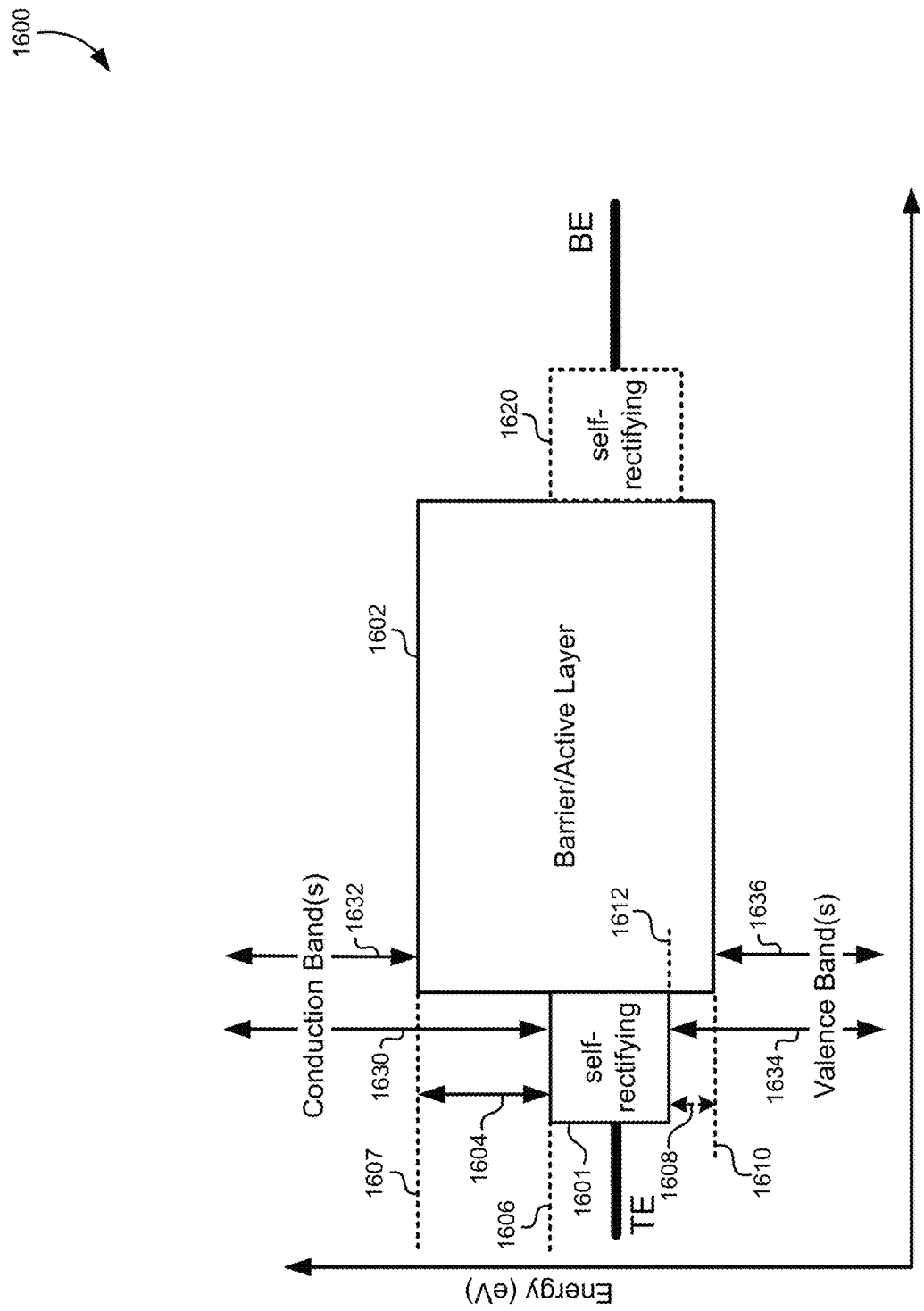
FIG. 16A illustrates the conduction band offset and the valence band offset, according to some embodiments.

The offsets between the conductance and valence bands determine the tunneling distance through the self-rectifying layer and the voltage required to overcome the combined barrier and active layer. To illustrate how the CBO and VBO values are measured on the energy band diagrams of a crested barrier device, FIG. 16A illustrates the CBO 1604 and the VBO 1608, according to some embodiments. The CBO 1604 represents a distance between the bottom 1606 of the conduction band 1630 of the self-rectifying layer 1601 and the bottom 1607 of the conduction band 1632 of the combined barrier and active layer 1602. Similarly, the VBO 1608 represents a distance between the top 1610 of the valence band 1636 of the combined barrier and active layer 1602 and the top 1612 of the valence band 1634 of the self-rectifying layer 1601. The same measurements may be made for another optional self-rectifying layer 1620 that may be included on the other side of the crested barrier device in some embodiments to make the device bidirectional.

Figure 16B:
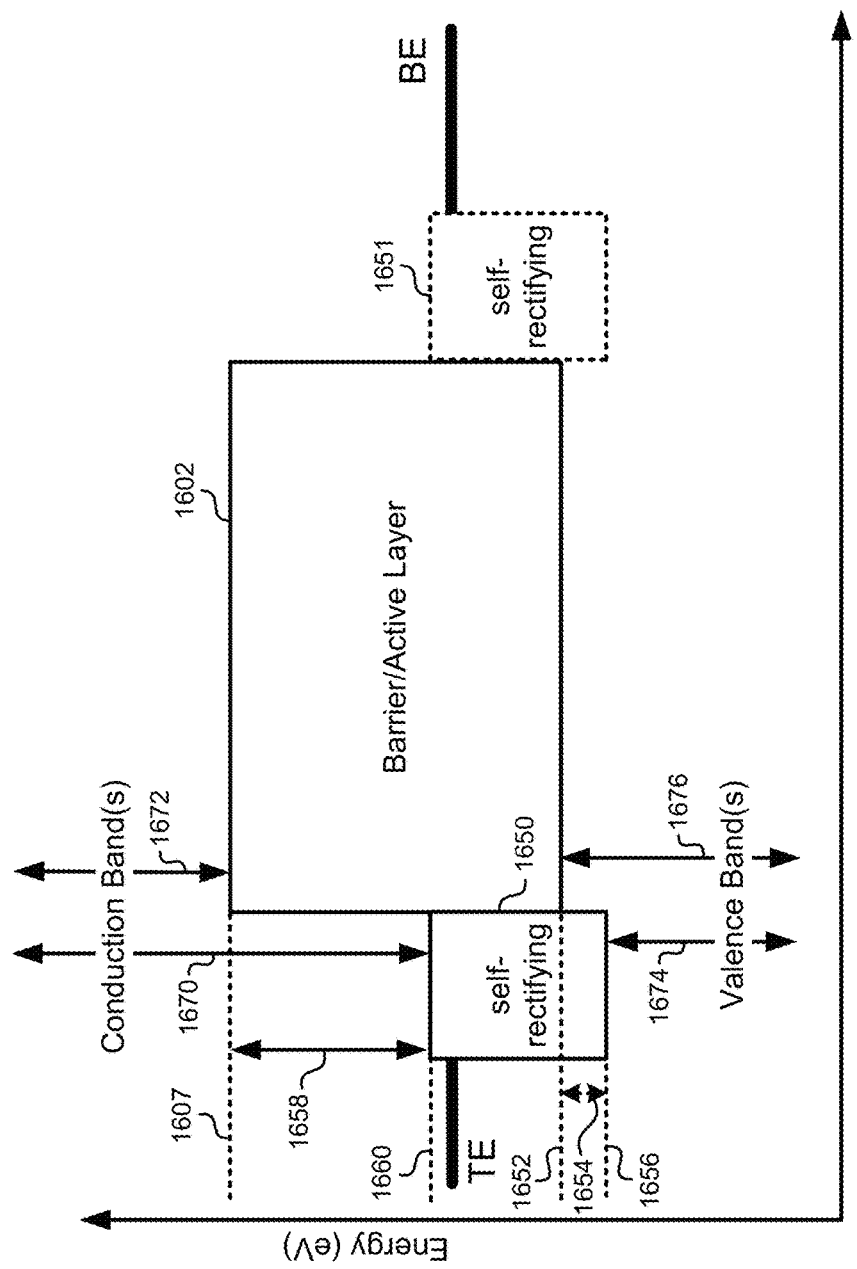
FIG. 16B illustrates how substitute materials may result in a decrease in the band offsets for the crested barrier device, according to some embodiments.

FIG. 16B illustrates how substitute materials may result in a decrease in the band offsets for the crested barrier device, according to some embodiments. Specifically, a self-rectifying layer 1650 comprised of a different material, such as $Ga_2O_3$, may decrease the VBO 1654 such that it is negative. In this example, the top 1656 of the valence band 1674 of the self-rectifying layer 1650 has dropped below the top 1652 of the valence band 1676 of the combined barrier and active layer 1602, resulting in a negative VBO 1654. Depending on the material, this may also increase the CBO 1658 as the distance between the bottom 1660 of the conduction band 1670 of the self-rectifying layer 1650 and the bottom 1607 of the conduction band 1672 of the combined barrier and active layer 1602 may increase.

This difference increases the voltage needed to overcome the combined barrier and active layer 1602 while decreasing the voltage required for setting the device in a condition that is favorable for tunneling through the self-rectifying layer 1650. Due to the fact that the probability of tunneling through the self-rectifying layer 1650 is increased, the device is still able to operate at approximately the same voltage, despite the possible increase of the CBO 1658. For example, the left side of the lobe 1202 in FIG. 12 may become steeper, as current increases through tunneling. This effectively increases the width of the node and the corresponding ON/OFF ratio.

Replacement materials for the combined barrier and active layer may also be characterized by their CBO and/or VBO ranges. For example, some embodiments may select materials that generate a VBO of between approximately −0.5 eV and approximately −1.5 eV. Similarly, some embodiments may select materials that generate a CBO of between approximately 1.75 eV and approximately 3.5 eV as illustrated in FIG. 15. Therefore, the example materials described above are provided only as examples of materials that meet these criteria. Other materials not illustrated specifically in FIG. 15 that meet these criteria may also be used as replacements for titanium oxide in the combined barrier and active layer.

Turning back to FIG. 15, replacement materials for the combined barrier and active layer may be characterized as materials that increase the CBO of the device while preferably also decreasing the VBO of the device. As illustrated in FIG. 15, region 1502 encompasses the titanium oxides uses a baseline material in the embodiments described above. In comparison, region 1504 encompasses various materials that may be used as replacements for the titanium oxides that increase the CBO and/or decrease the VBO. By way of example, these materials may include $SrHfO_3$, $BaZrO_3$, $SrZrO_3$, $Sr_2Nb_2O_7$, $SrY_2O_4$, and/or other materials that may fall within region 1504. Replacement materials for the combined barrier and active layer may thus be characterized in comparison to the CBO and/or VBO provided by titanium oxides in region 1502. Similarly, any of the electrode materials that generate a work function differential as described above may be used with these substitute materials.

FIG. 17 illustrates a table 1700 of material properties for the potential replacement materials that may be used in the crested barrier device, according to some embodiments. Potential materials to be used as the combined barrier and active layer may be selected from the table 1700 based on the material properties. The table 1700 illustrates the bandgap energy 1702 for each material. The table 1700 also list the formation energy 1704. The larger the magnitude formation energy 1704 (i.e., the more negative the value), the more stable the material will be, which may be a design factor in some operating and fabrication/manufacturing environments. Additionally, the table 1700 illustrates the dielectric constant 1703 for each material, which may be inversely proportional to the bandgap energy 1702.

The table 1700 includes calculations for these materials serving as a replacement material for the combined barrier and active layer in a crested barrier device. For example, calculated VBO values 1706 and CBO values 1708 on $Ga_2O_3$ are also illustrated in the table 1700. Therefore, various materials may be selected from the table 1700 based on the design specifications for a particular crested barrier device. Alternatively, similar values may be calculated and/or simulated for other materials having a CBO and/or VBO range described above to be used as replacement materials for this layer.

The same thicknesses for the self-rectifying layer and the combined barrier and active layer described above for the crested barrier device may be used with the replacement materials. Generally, as the dielectric constant for the material of any layer increases, the thickness of that layer may increase by a proportional amount such that the overall capacitance of the layer remains approximately the same (capacitance is proportional to k-value but inversely proportional to thickness of the film). Specifically, as the dielectric constant increases, the capacitance of the layer may be maintained by increasing the thickness of the layer. As the dielectric constant decreases in the replacement material, the capacitance of the layer can be maintained by decreasing the thickness of the layer. Thus, replacement materials may be used for titanium oxide that have varying dielectric constants while maintaining the same electric field strength within each layer by adjusting the thickness accordingly.

In addition to replacing the materials used for the combined barrier and active layer to fall within the specified CBO and/or VBO ranges, some embodiments may alternatively replace the titanium oxide in the combined barrier and active layer in order to increase the diffusion constant of the species within it. Increasing the diffusion constant of the material may improve the speed and improve the barrier to be overcome in order to move the species with which the oxygen ions and vacancies move back and forth in the combined barrier and active layer. These replacement materials may include $V_2O_5$, $Ta_2O_5$, $CuO$, $Fe_2O_3$, $ZnO$, $Ga_2O_3$, and/or other similar materials.

Turning back briefly to FIG. 13, the same method may be used to form a crested barrier device using substitute materials for the combined barrier and active layer and/or for the self-rectifying layer. For example, when forming the first tunneling layer (1304) and/or forming an optional second tunneling layer (1308), cobalt oxide may be used as described above, or a substitute materials such as IGZO or $Cr_2O_3$ may be used instead. Similarly, when forming the active layer (1306), titanium oxide may be used as described above, or substitute materials such as $SrHfO_3$, $BaZrO_3$, $SrZrO_3$, $Sr_2Nb_2O_7$, $SrY_2O_4$, may be used instead. Other similar materials may also be used that fall within the VBO and/or CBO ranges described above.

Figure 18:
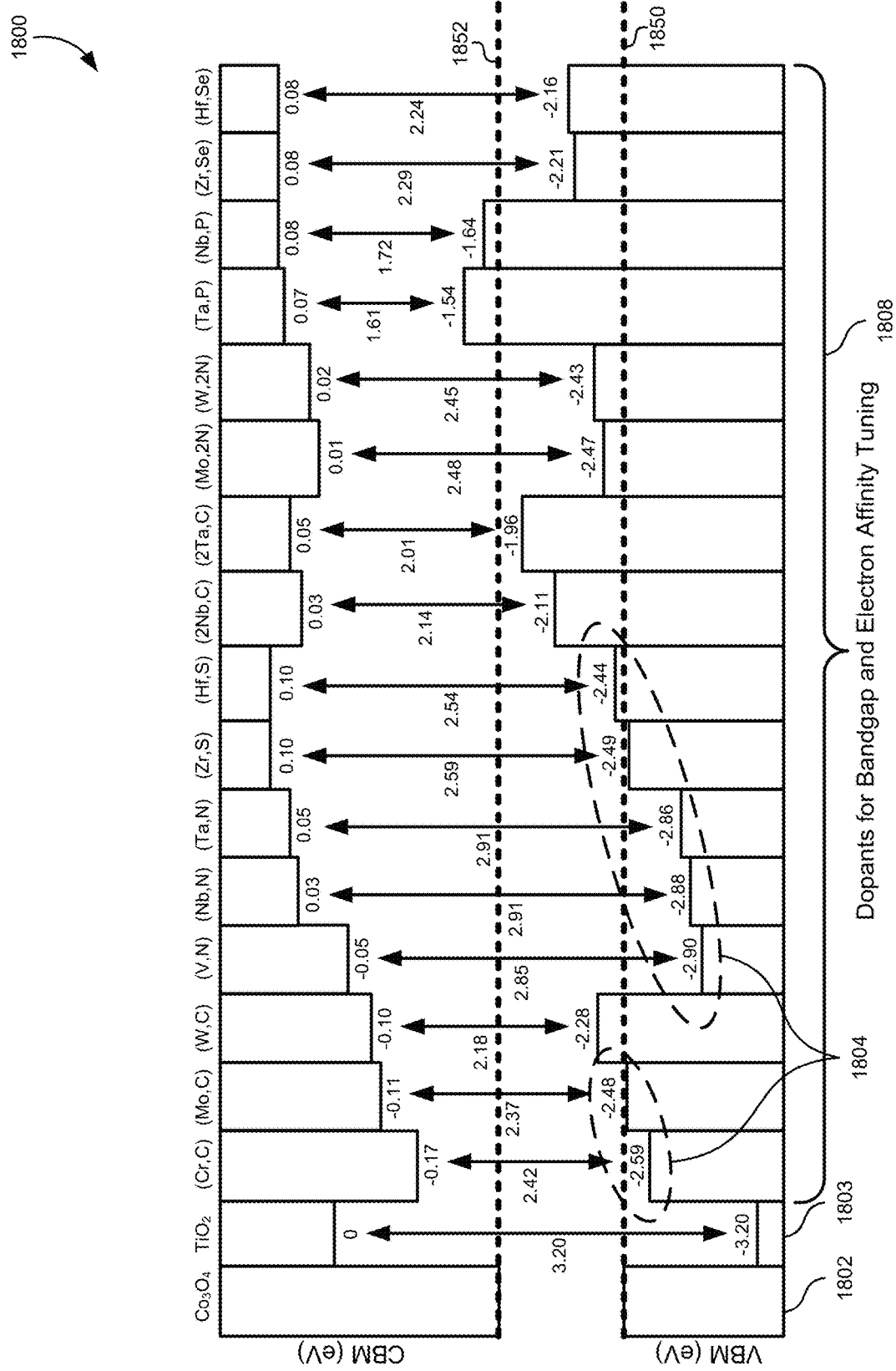
FIG. 18 illustrates a graph of different materials that may be used to dope the combined barrier and active layer in a crested barrier device, according to some embodiments.

FIG. 18 illustrates a graph 1800 of different materials that may be used to dope the combined barrier and active layer in a crested barrier device, according to some embodiments. Instead of replacing the titanium oxide with a different material to decrease the VBO and/or increase the CBO of the device, some embodiments may instead dope the titanium oxide of the combined barrier and active layer in order to produce the same effect. FIG. 18 illustrates the band gap variation as well as the Conductance Band Minimum (CBM) 1852 and the Valence Band Maximum (VBM) 1850 for different materials 1808 that may be used to dope the titanium oxide in the combined barrier and active layer. The CBO may represent the difference between the material's CBM minimum and the CBM 1852 for $Co_3O_4$ as a reference, while VBO may represent the difference between material's VBM and the $Co_3O_4$ reference material's VBM 1850. Note that for given material the energetic band between the CBM and the VBM for each dopant denotes the bandgap of the dielectric/material representing a "forbidden zone," which is the energy gap between valence band and conduction band. The arrows in FIG. 18 denote the bandgaps of each material, while the VBO between the reference $Co_3O_4$ material and any of the other materials 1808, as well as the CBO between the reference $Co_3O_4$ and any of the materials 180 are visually apparent in FIG. 18.

First, as reference the CBM and VBM for the cobalt oxide 1802 used in the self-rectifying layer(s) is illustrated on the left side of the graph 1800. Next, the CBM and VBM for the un-doped titanium oxide 1803 in the combined barrier and active layer is illustrated. The remainder of the graph 1800 illustrates the effect of different materials 1808 on the VBM and CBM of the combined barrier and active layer when used to dope the titanium oxide. The graph 1800 identifies candidate materials 1804 that may result in a decreased VBM and/or increased CBM for the combined barrier and active layer. For example, chromium (Cr), molybdenum (Mo), vanadium (V), niobium (Nb), tantalum (Ta), zirconium (Zr), hafnium (Hf), and/or other similar materials may be used to dope the titanium oxide to increase the gap between the VBM and CBM. As described above for the substitute materials that may be used for the combined barrier and active layer, this doping process may produce a similar effect on the crested barrier device by increasing the memory window and the ON/OFF ratio of the device.

Turning back briefly to FIG. 13, the same method may be used to form a crested barrier device with a doped combined barrier and active layer. For example, after forming the active layer (1306), an additional step may be added whereby the titanium oxide used to form the active layer (i.e., the combined barrier and active layer) may be doped with a material that increases the gap between the VBM and the CBM of the device. The amount of dopant used in this process may be proportional to the increase in this gap. Therefore, a designer of the crested barrier device may target a specific change to the VBM and/or CBM and may increase/decrease the amount of dopant accordingly until the desired results are achieved. These dopant levels may be determined through simulations or other techniques. Similarly, any of the electrode materials that generate a work function differential as described above may be used with these substitute materials.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the example embodiments will provide those skilled in the art with an enabling description for implementing an example embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

In the foregoing specification, aspects various embodiments are described with reference to specific embodiments, but those skilled in the art will recognize that the invention is not limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A crested barrier memory device comprising:
    a first electrode;
    a first self-rectifying layer;
    a combined barrier and active layer, wherein:
        the first self-rectifying layer is between the first electrode and the active layer;
        a conduction band offset between the first self-rectifying layer and the combined barrier and active layer is greater than 1.5 eV; and
        a valence band offset between the first self-rectifying layer and the combined barrier and active layer is less than −0.5 eV; and
    a second electrode, wherein the active layer is between the first self-rectifying layer and the second electrode.

2. The device of claim 1, further comprising a second self-rectifying layer between the combined barrier and active layer and the second electrode.

3. The device of claim 1, wherein the conduction band offset is less than approximately 3.5 eV.

4. The device of claim 1, wherein the valence band offset is greater than approximately −1.5 eV.

5. The device of claim 1, wherein there is no barrier layer between the first self-rectifying layer and the combined barrier and active layer.

6. The device of claim 1, further comprising one or more connections to a plurality of other crested barrier memory and selector devices in a neural network.

7. The device of claim 6, wherein the device models the behavior of a synapse.

8. The device of claim 1, wherein a dielectric constant of the first self-rectifying layer is at least 1.5 times larger than a dielectric constant of the combined barrier and active layer.

9. The device of claim 1, wherein the combined barrier and active layer has a higher diffusion constant than titanium oxide.

10. The device of claim 9, wherein the combined barrier and active layer comprises $V_2O_5$, $Ta_2O_5$, $CuO$, $Fe_2O_3$, $ZnO$, or $Ga_2O_3$.

11. A method of fabricating a crested barrier memory device, the method comprising:
    depositing a first electrode;
    depositing a first self-rectifying layer above the first electrode;
    depositing a combined barrier and active layer over the first self-rectifying layer, wherein:
        a conduction band offset between the first self-rectifying layer and the combined barrier and active layer is greater than 1.5 eV; and
        a valence band offset between the first self-rectifying layer and the combined barrier and active layer is less than −0.5 eV; and
    depositing a second electrode above the combined barrier and active layer.

12. The method of claim 11, further comprising:
    depositing a second self-rectifying layer over the combined barrier and active layer.

13. The method of claim 11, wherein the first self-rectifying layer comprises cobalt oxide.

14. The method of claim 11, wherein the first self-rectifying layer comprises $Ga_2O_3$, IGZO, or $Cr_2O_3$.

15. The method of claim 11, wherein the combined barrier and active layer comprises titanium oxide.

16. The method of claim 15, wherein the titanium oxide is doped with Cr, Mo, V, Nb, Ta, Zr, or Hf.

17. The method of claim 11, wherein the combined barrier and active layer comprises $SrHfO_3$, $BaZrO_3$, $SrZrO_3$, $Sr_2Nb_2O_7$, or $SrY_2O_4$.

18. The method of claim 11, wherein:
the first electrode comprises a first material and the second electrode comprises a second material that is different from the first material, and
a work function associated with first electrode is less than a work function associated with the second electrode.

19. The method of claim 18, wherein the first electrode comprises titanium nitrite and the second electrode comprises platinum.

20. The method of claim 11, a tunneling distance comprises a length of the crested barrier memory device when 0 V is applied.

* * * * *